(12) United States Patent
Tsuchitani et al.

(10) Patent No.: US 10,020,362 B2
(45) Date of Patent: Jul. 10, 2018

(54) SEMICONDUCTOR DEVICE AND METHOD OF MANUFACTURING THE SAME

(71) Applicant: KABUSHIKI KAISHA TOSHIBA, Tokyo (JP)

(72) Inventors: Masanobu Tsuchitani, Kanazawa Ishikawa (JP); Hideki Okumura, Nonoichi Ishikawa (JP); Sadayuki Jimbo, Kanazawa Ishikawa (JP); Takuya Yamaguchi, Nomi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/252,116

(22) Filed: Aug. 30, 2016

(65) Prior Publication Data

US 2017/0069714 A1    Mar. 9, 2017

(30) Foreign Application Priority Data

Sep. 4, 2015 (JP) .................................. 2015-174411
Mar. 15, 2016 (JP) .................................. 2016-051699

(51) Int. Cl.
 *H01L 29/739* (2006.01)
 *H01L 29/06* (2006.01)
 *H01L 29/861* (2006.01)

(52) U.S. Cl.
 CPC ........ *H01L 29/0661* (2013.01); *H01L 29/861* (2013.01)

(58) Field of Classification Search
None
See application file for complete search history.

(56) References Cited

U.S. PATENT DOCUMENTS

| | | | |
|---|---|---|---|
| 7,564,107 B2 | 7/2009 | Yanagisawa et al. | |
| 7,812,392 B2 | 10/2010 | Saito et al. | |
| 8,148,788 B2 | 4/2012 | Suzuki et al. | |
| 8,232,593 B2 * | 7/2012 | Saito | H01L 29/0619 257/168 |
| 8,809,942 B2 | 8/2014 | Matsuda et al. | |
| 9,859,419 B1 * | 1/2018 | Loechelt | H01L 29/7827 |
| 2010/0044839 A1 | 2/2010 | Okada et al. | |
| 2014/0199814 A1 * | 7/2014 | Darwish | H01L 29/0634 438/270 |

(Continued)

FOREIGN PATENT DOCUMENTS

JP          5494217 B2    5/2014

*Primary Examiner* — Ali Naraghi
(74) *Attorney, Agent, or Firm* — Patterson & Sheridan, LLP

(57) ABSTRACT

A semiconductor device includes a first semiconductor region of a first conductivity type, a second semiconductor region of the first conductivity type, a third semiconductor region of the second conductivity type, and an insulating portion. The second semiconductor region is provided on the first semiconductor region. The third semiconductor region is provided on the second semiconductor region. The insulating portion is located in a vicinity of, and contacts, the second semiconductor region and the third semiconductor region, and the insulating portion includes a plurality of voids therein, the plurality of voids extending around the second semiconductor region.

16 Claims, 29 Drawing Sheets

(56) References Cited

U.S. PATENT DOCUMENTS

2015/0380538 A1* 12/2015 Ogawa ................ H01L 29/4236
　　　　　　　　　　　　　　　　　　　　　　257/144
2016/0254179 A1* 9/2016 Yen .................... H01L 21/76224
　　　　　　　　　　　　　　　　　　　　　　257/506

* cited by examiner

SEMICONDUCTOR DEVICE AND METHOD OF MANUFACTURING THE SAME

CROSS-REFERENCE TO RELATED APPLICATION

This application is based upon and claims the benefit of priority from Japanese Patent Application No. 2015-174411, filed Sep. 4, 2015, and Japanese Patent Application No. 2016-051699, filed Mar. 15, 2016; the entire contents of both applications are incorporated herein by reference.

FIELD

Embodiments described herein relate generally to a semiconductor device and a method of manufacturing the same.

BACKGROUND

In semiconductor devices such as a diode, an insulating portion may be provided in the vicinity of a semiconductor region in order to improve breakdown voltage. A further improvement in breakdown voltage is required for such a semiconductor device.

DETAILED DESCRIPTION

Figure 1:
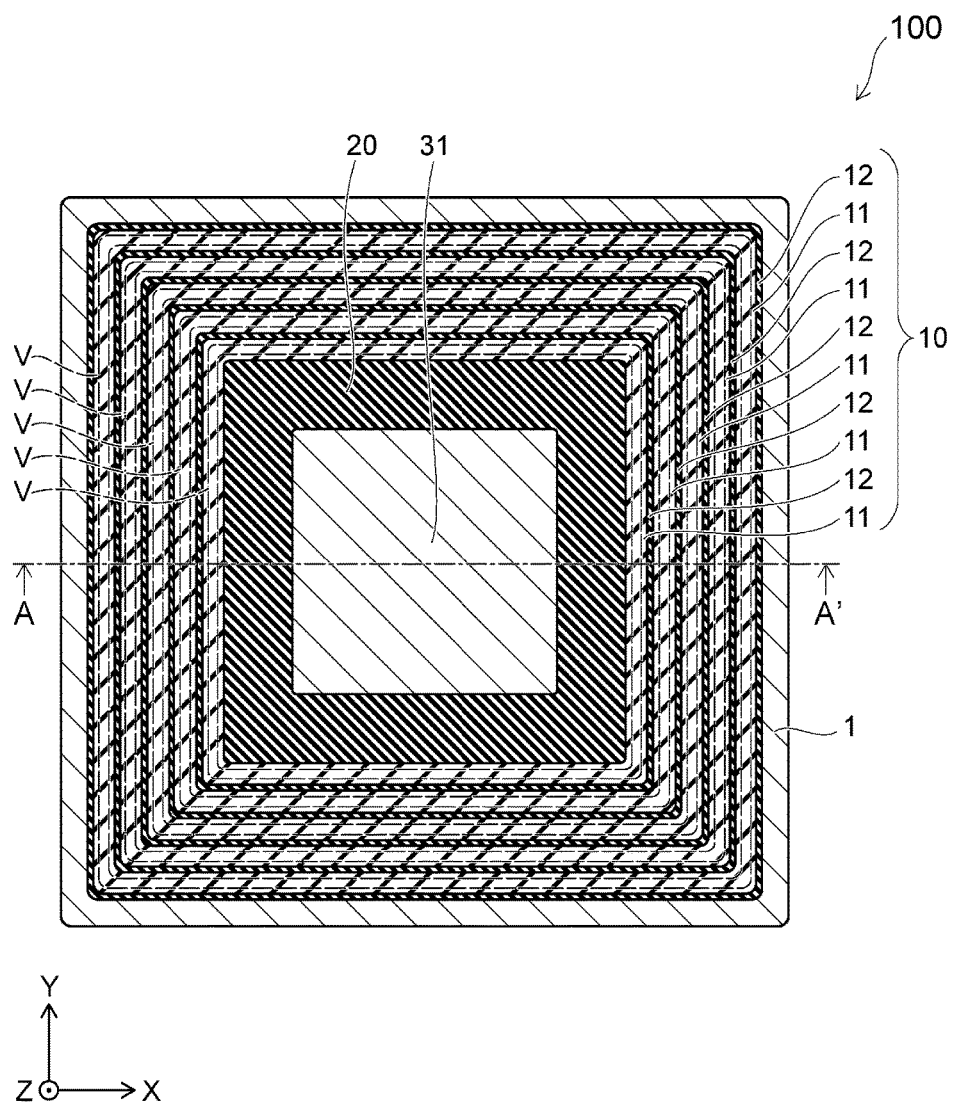
FIG. 1 is a plan view of a semiconductor device according to a first embodiment.

Embodiments provide a semiconductor device capable of improved breakdown voltage, and a method of manufacturing the same.

In general, according to one embodiment, there is provided a semiconductor device including a first semiconductor region of a first conductivity type, a second semiconductor region of the first conductivity type located on the first semiconductor region, a third semiconductor region a second conductivity type located on the second semiconductor region, and an insulating portion located in a vicinity of, and contacting, the second semiconductor region and the third semiconductor region. The insulating portion comprises a plurality of voids therein, and the plurality of voids extends around the second semiconductor region.

Hereinafter, embodiments will be described with reference to the accompanying drawings.

The drawings are schematic or conceptual. The relationship between the thicknesses and widths of portions, a ratio of size between portions, or the like are not necessarily the same as in actual devices. In addition, even when the same portions of a device are represented, dimensions and ratios between the portions may be represented differently depending on the drawings.

In the disclosure, components similar to those described already are denoted by the same reference numerals and signs, and a detailed description thereof will be omitted as appropriate.

An xyz orthogonal coordinate system is used in describing each embodiment. A direction from an $n^-$ type semiconductor region 2 toward a p-type semiconductor region 3 is set to be a Z-direction (first direction). In addition, two directions that are perpendicular to the Z-direction and intersect each other are set to be an X-direction and a Y-direction.

In the following description, the signs of $n^+$, $n^-$, $p^+$, and p indicate the relative levels of impurity concentrations in respective conductivity types. That is, a "+" sign indicates that the impurity concentration is relatively higher than that where no sign or a "−" sign is given, and a "−" sign indicates that the impurity concentration is relatively lower than where no sign or a "+" sign is given.

Regarding embodiments to be described below, the embodiments may be implemented by reversing the p-type and n-type of each semiconductor region.

First Embodiment

An example of a semiconductor device according to a first embodiment will be described with reference to FIGS. 1 and 2.

FIG. 1 is a plan view of a semiconductor device according to the first embodiment.

Figure 2:
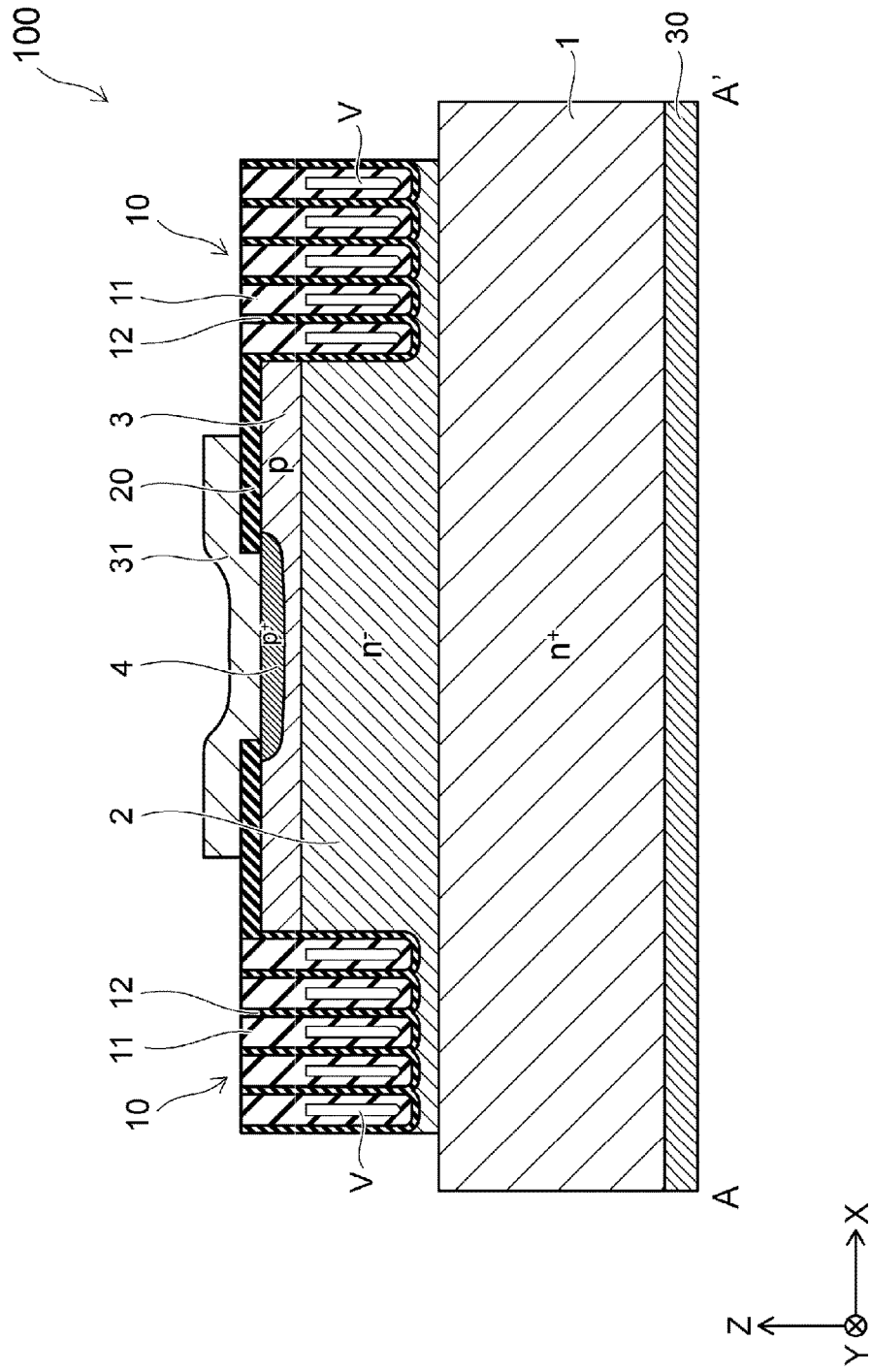
FIG. 2 is a cross-sectional view taken along line A-A' of FIG. 1.

FIG. 2 is a cross-sectional view taken along line A-A' of FIG. 1.

Meanwhile, voids V are indicated by a dashed line in FIG. 1.

The semiconductor device 100 is, for example, a diode.

As illustrated in FIGS. 1 and 2, the semiconductor device 100 includes an $n^+$ type (first conductivity type) cathode region 1 (first semiconductor region), an $n^-$ type semiconductor region 2 (second semiconductor region), a p-type (second conductivity type) semiconductor region 3 (third semiconductor region), a $p^+$ type anode region 4 (fourth semiconductor region), an insulating portion 10 including voids therein extending around the $n^-$ type semiconductor region 2 (second semiconductor region) and p-type (second conductivity type) semiconductor region 3 (third semiconductor region), an insulating portion 20, a cathode electrode 30, and an anode electrode 31.

As illustrated in FIG. 1, the anode electrode 31 is provided on the upper surface of the semiconductor device 100. The insulating portion 20 is provided in the vicinity of the anode electrode 31. The insulating portion 10 is provided in the vicinity of the insulating portion 20.

As illustrated in FIG. 2, the cathode electrode 30 is provided on the lower surface of the semiconductor device 100.

The $n^+$ type cathode region 1 is provided on the cathode electrode 30, and is electrically connected to the cathode electrode 30.

The $n^-$ type semiconductor region 2 is provided on a portion of the $n^+$ type cathode region 1.

The p-type semiconductor region 3 is provided on the $n^-$ type semiconductor region 2.

The $p^+$ type anode region 4 is selectively provided on the p-type semiconductor region 3.

The anode electrode 31 is located on the $p^+$ type anode region 4, and is electrically connected to the $p^+$ type anode region 4. The insulating portion 20 is provided between the anode electrode 31 and the p-type semiconductor region 3.

The structure of the anode electrode 31 is not limited to the examples illustrated in FIGS. 1 and 2. For example, the anode electrode 31 may be provided on the entire surface of the p-type semiconductor region 3 through the insulating portion 20, or may be provided on at least a portion of the insulating portion 10 in addition to being provided on the entire surface of the p-type semiconductor region 3.

The insulating portion 10 is provided on another portion of the $n^+$ type cathode region 1. In addition, the insulating portion 10 is provided in the vicinity of the $n^-$ type semiconductor region 2 and the p-type semiconductor region 3 along an X-Y plane, and comes into contact with the $n^-$ type semiconductor region 2 and the p-type semiconductor region 3.

In the example illustrated in FIG. 2, a portion of the $n^-$ type semiconductor region 2 is provided between the $n^+$ type cathode region 1 and the insulating portion 10 in the Z-direction, but the insulating portion 10 may be provided so as to come into contact with the $n^+$ type cathode region 1.

The insulating portion 10 includes a first insulating portion 11 and a second insulating portion 12. The first insulating portion 11 and the second insulating portion 12 include a common first insulating material, and the density of the first insulating material in the second insulating portion 12 is higher than the density of the first insulating material in the first insulating portion 11.

As illustrated in FIG. 2, the insulating portion 10 includes the plurality of first insulating portions 11. As illustrated in FIGS. 1 and 2, the first insulating portions 11 are provided in an annular shape, and are provided in the vicinity of the $n^-$ type semiconductor region 2 and the p-type semiconductor region 3 along an X-Y plane. In addition, each of the first insulating portions 11 has a void V, and the voids V surround the $n^-$ type semiconductor region 2 in the X-Y plane. In the examples illustrated in FIGS. 1 and 2, the voids V are aligned with only the $n^-$ type semiconductor region 2 in the X-direction and the Y-direction, but may further be aligned with the p-type semiconductor region 3.

The first insulating portion 11 and a portion of the second insulating portion 12 are alternately provided in a second direction (direction from the center of the semiconductor device 100 toward the outer circumference thereof, i.e., they extend in the X and the Y directions) which is perpendicular to the Z-direction.

The plurality of first insulating portions 11 may be integrally provided. For example, one insulating layer having the plurality of first insulating portions 11 and the plurality of voids V may be provided on the second insulating portion 12.

Next, the insulating portion 10 and the structure in the vicinity thereof will be described in detail with reference to FIG. 3.

Figure 3:
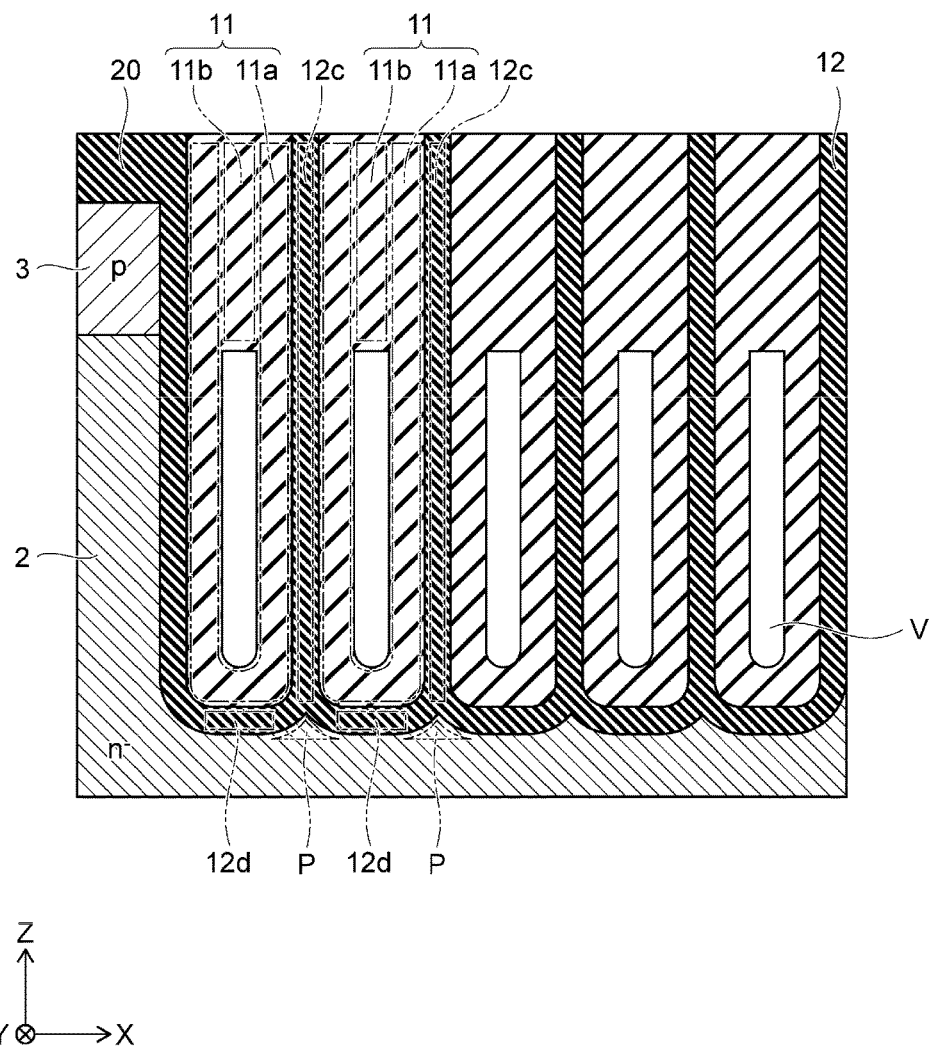
FIG. 3 is a partially enlarged cross-sectional view of the vicinity of an insulating portion of FIG. 2.

FIG. 3 is a partially enlarged cross-sectional view of the vicinity of the insulating portion 10 of FIG. 2.

Each of the first insulating portions 11 includes a first insulating region 11a and a second insulating region 11b.

The second insulating region 11b includes at least one first element selected from a first group consisting of group 13 elements and group 15 elements. For example, the second insulating region 11b includes at least one of boron and phosphorus.

On the other hand, the first insulating region 11a does not include the first element. Alternatively, even when the first insulating region 11a includes the first element, the concentration of the first element in the first insulating region 11a is lower than the concentration of the first element in the second insulating region 11b.

The void V is located between the first insulating region 11a and the second insulating region 11b in the Z-direction.

The second insulating portion 12 includes a plurality of third insulating regions 12c and a plurality of fourth insulating regions 12d.

The third insulating region 12c is located between the first insulating portions 11 in the X and the Y directions. The fourth insulating region 12d is located between the n$^+$ type cathode region 1 and the first insulating portion 11 in the Z-direction. That is, the third insulating region 12c is located at the side of the first insulating portion 11, and the fourth insulating region 12d is located below the first insulating portion 11.

The n$^-$ type semiconductor region 2 includes a protrusion portion P protruding toward the insulating portion 10. The plurality of protrusion portions P are provided in the second direction. Each of the protrusion portions P is aligned with the third insulating region 12c in the Z-direction, and is located between the fourth insulating regions 12d in the second direction.

Here, an example of a material of each component will be described.

The n$^+$ type semiconductor region 1, the n$^-$ type semiconductor region 2, the p-type semiconductor region 3, and the p$^+$ type anode region 4 include silicon, a silicon carbide, a gallium nitride, or a gallium arsenide.

As an n type impurity added to a semiconductor material, arsenic, phosphorus, or antimony can be used. As a p-type impurity, boron can be used.

As the first insulating material included in the insulating portion 10, a silicon oxide can be used.

The cathode electrode 30 and the anode electrode 31 contain a metal material such as aluminum.

Next, an example of a method of manufacturing the semiconductor device 100 according to the first embodiment will be described.

FIG. 4 and FIGS. 6 to 12 are cross-sectional views illustrating the results of a process of manufacturing the semiconductor device 100 according to the first embodiment.

Figure 5:
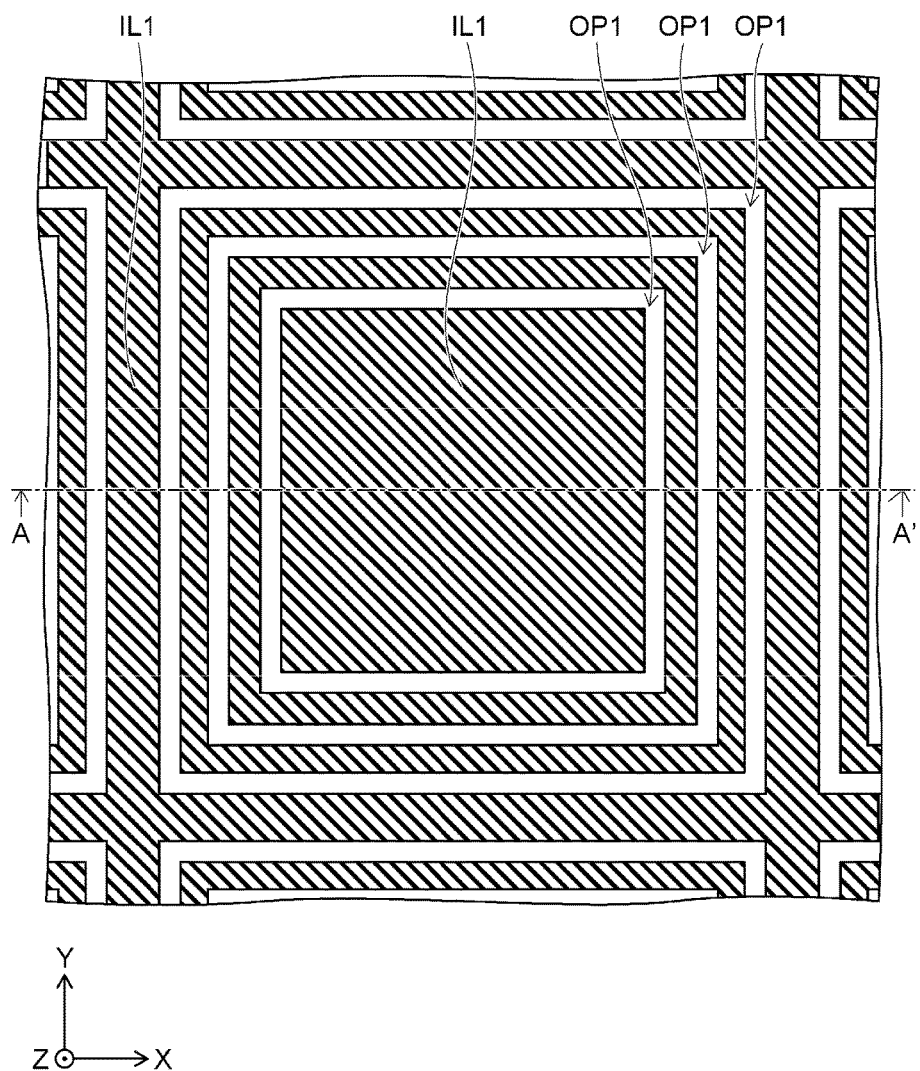
FIG. 5 is a plan view illustrating a step in the process of manufacturing the semiconductor device according to the first embodiment.

FIG. 5 is a plan view illustrating the result of a process of manufacturing the semiconductor device 100 according to the first embodiment.

Figure 4:
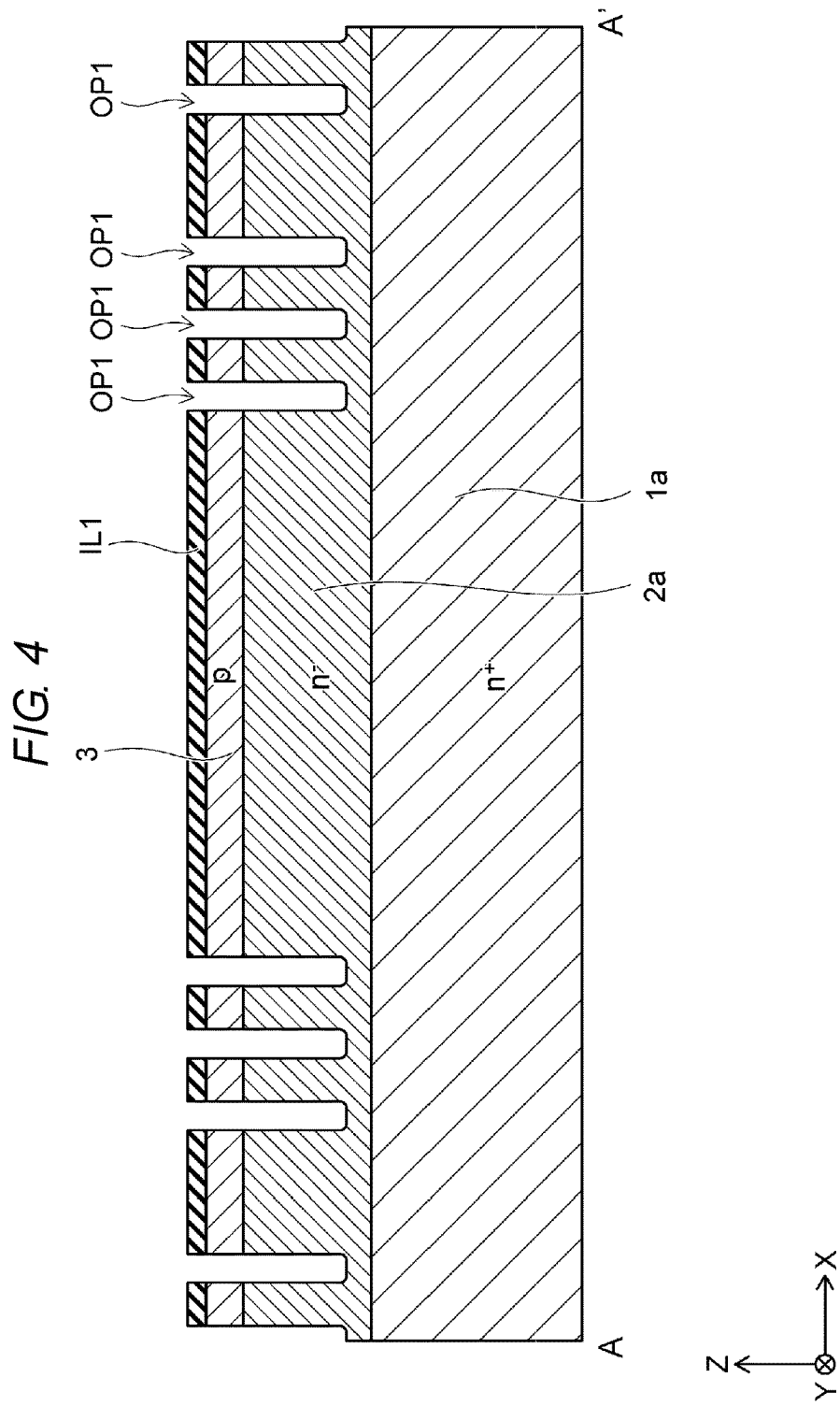
FIG. 4 is a cross-sectional view illustrating a step in the process of manufacturing a semiconductor device according to the first embodiment.

FIG. 4 is equivalent to a cross-sectional view taken along line A-A' of FIG. 5. In addition, FIGS. 6 to 12 illustrate a manufacturing process at a location given line A-A' of FIG. 5.

First, an n$^+$ type semiconductor layer 1a and an n$^-$ type semiconductor layer 2a (first semiconductor layer) provided on the n$^+$ type semiconductor layer 1a are prepared. The n$^+$ type semiconductor layer 1a and the n$^-$ type semiconductor layer 2a include, for example, single crystal silicon. Next, p-type impurities are ion-implanted onto the surface of the n$^-$ type semiconductor layer 2a to thereby form a p-type semiconductor region 3. Subsequently, an insulating layer IL1 is formed on the surface of the p-type semiconductor region 3 by performing thermal oxidation. Subsequently, the insulating layer IL1 is patterned by a photolithography and a reactive ion etching (RIE) method. Meanwhile, the p-type semiconductor region 3 may be formed after an insulating layer is formed on the surface of the n$^-$ type semiconductor layer 2a. Alternatively, the p-type semiconductor region 3 may be formed after the insulating portion 10 to be described later is formed.

Subsequently, a plurality of first openings OP1 are formed by a RIE method using the patterned insulating layer IL1 as a mask, as illustrated in FIG. 4. The first opening OP1 passes through the p-type semiconductor region 3 and reaches the n$^-$ type semiconductor layer 2a. The first opening OP1 may further pass through the n$^-$ type semiconductor layer 2a and may reach the n$^+$ type semiconductor layer 1a. The first openings OP1 are formed so as to be separated from each other. In addition, the first openings OP1 are formed in an annular shape so as to surround a portion of the n$^-$ type semiconductor layer 2a and a portion of the p-type semiconductor region 3, as illustrated in FIG. 5.

Next, an insulating layer IL2 (first insulating layer) is formed along the inner wall of the first opening OP1 by performing thermal oxidation. Subsequently, an insulating layer IL3 including a silicon oxide is formed on the insulating layer IL2 using a chemical vapor deposition (CVD) method. At this time, the insulating layer IL2 is formed along the inner wall of the first opening OP1 so that the first opening OP1 is not filled. The insulating layer IL3 is formed without, for example, an n-type impurity (group 15 element) and a p-type impurity (group 13 element) added thereto.

Figure 6:
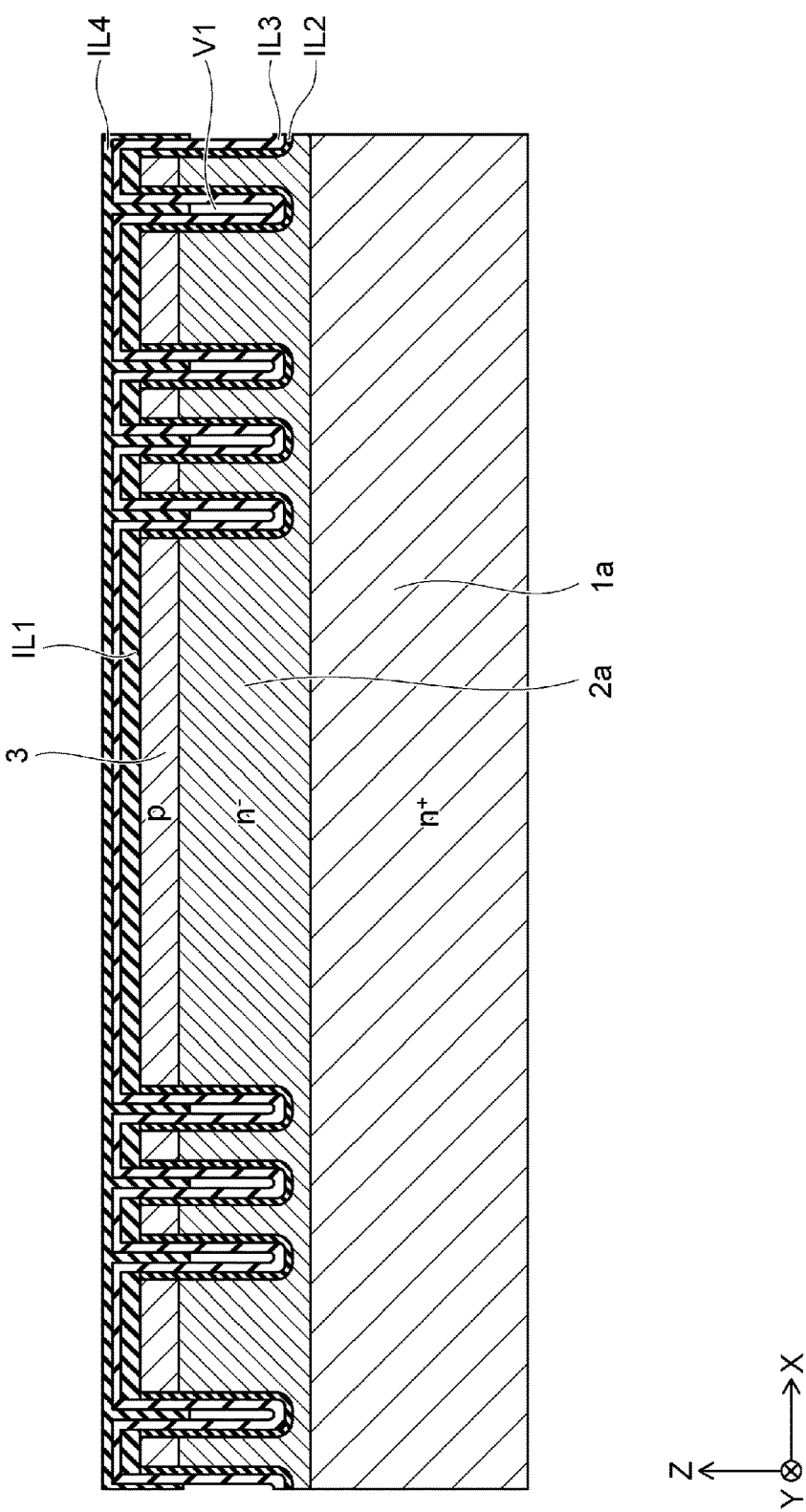
FIG. 6 is a cross-sectional view illustrating a step in the process of manufacturing the semiconductor device according to the first embodiment.

Next, an insulating layer including boro-phospho-silicate-glass (BPSG) is formed on the insulating layer IL3 using a CVD method. Subsequently, an insulating layer IL4 (third insulating layer) is formed by making the insulating layer including BPSG reflow. At this time, the insulating layer IL4 is formed so as to cover the first opening OP1 without filling the first opening OP1. As a result, as illustrated in FIG. 6, a void V1 is formed between the insulating layer IL3 and the insulating layer IL4.

Next, the upper surface of the insulating layer IL4 is polished by a CMP method. A portion of the insulating layer IL3 and a portion of the insulating layer IL4 are removed by this process. Here, the thickness of the insulating layer to be polished is arbitrary. The polishing may be performed so that only a portion of the insulating layer IL4 is removed, or may be performed so that a portion of the insulating layer IL1 is removed in addition to a portion of the insulating layer IL3 and a portion of the insulating layer IL4.

Figure 7:
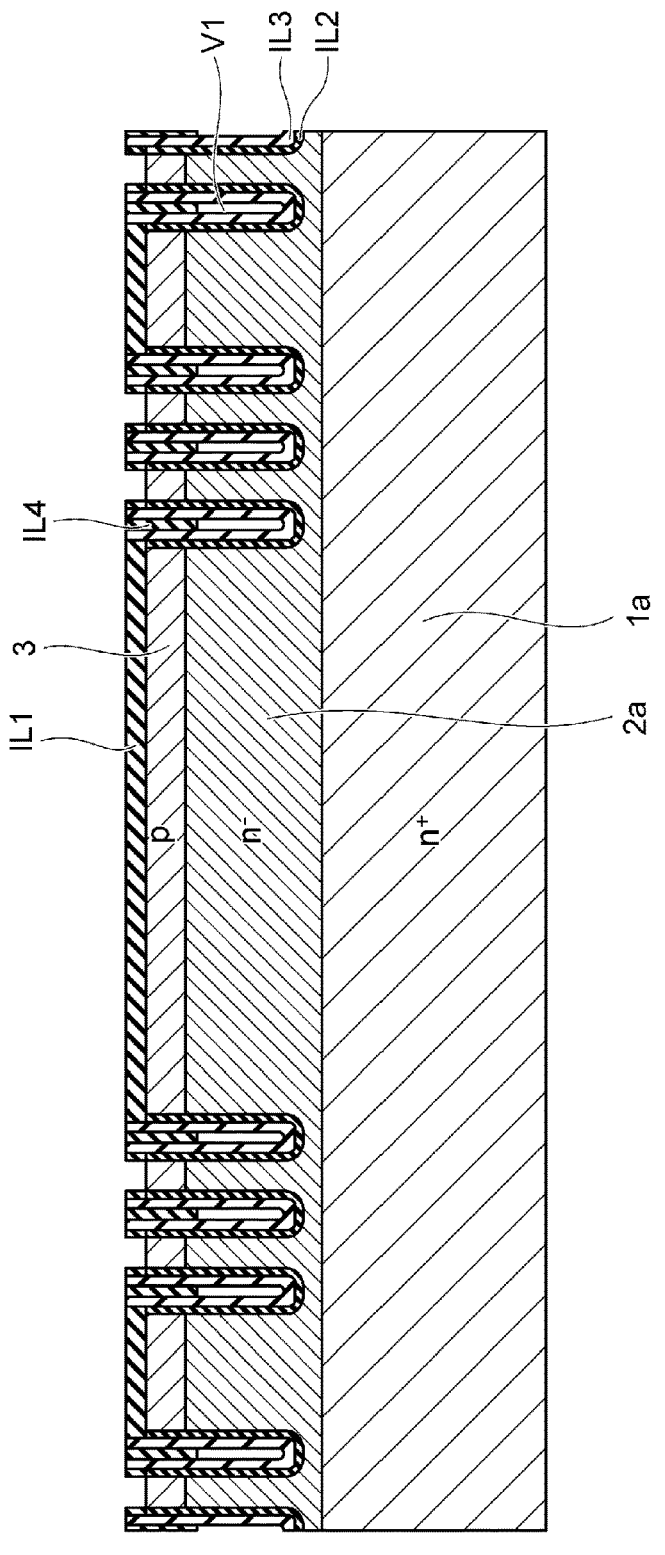
FIG. 7 is a cross-sectional view illustrating a step in the process of manufacturing the semiconductor device according to the first embodiment.

Next, as illustrated in FIG. 7, a portion of the insulating layer IL1 is removed by a photolithography and an RIE method. The insulating layer IL1 is patterned so that the p-type semiconductor region 3 located between the insulating layers IL2 is exposed. When not only the insulating layer IL1 but also the insulating layer IL3 and the insulating layer IL4 are provided on the surface of the p-type semiconductor region 3, the insulating layers are also patterned.

Figure 8:
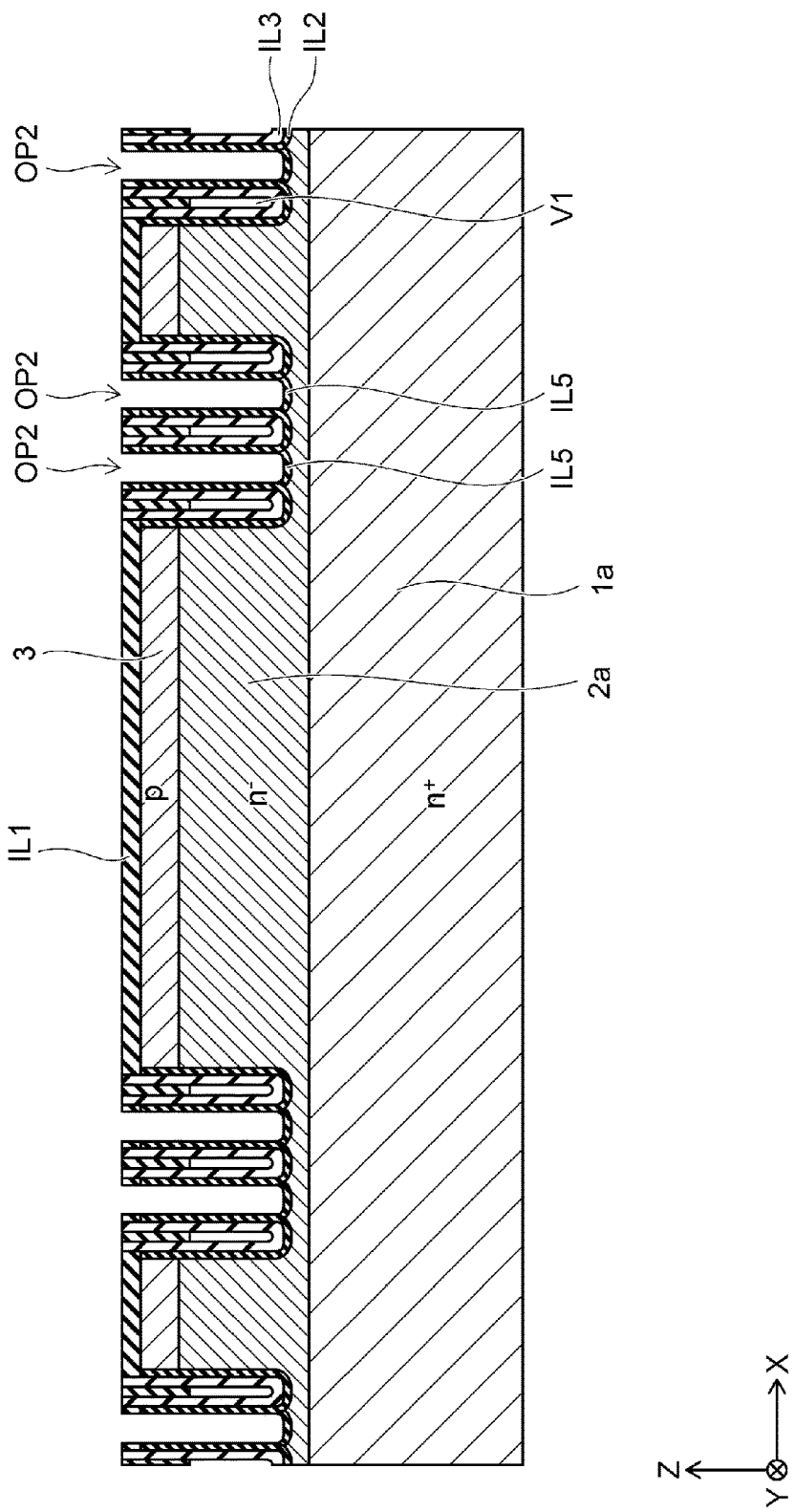
FIG. 8 is a cross-sectional view illustrating a step in the process of manufacturing the semiconductor device according to the first embodiment.

Next, a portion of the p-type semiconductor region 3 located between the insulating layers IL2 and a portion of the n$^-$ type semiconductor layer 2a are removed by an RIE method using the patterned insulating layer IL1 as a mask. The plurality of second openings OP2 are formed along the insulating layer IL2 so as to be separated from each other by this process. The second openings OP2 are formed in an annular shape so as to surround a portion of the n$^-$ type semiconductor layer 2a and a portion of the p-type semiconductor region 3. Subsequently, as illustrated in FIG. 8, an insulating layer IL5 (second insulating layer) is formed along the bottom of the second opening OP2 by performing thermal oxidation.

Meanwhile, the width of the second opening OP2 may be the same as or different from the width of the first opening OP1.

Figure 9:
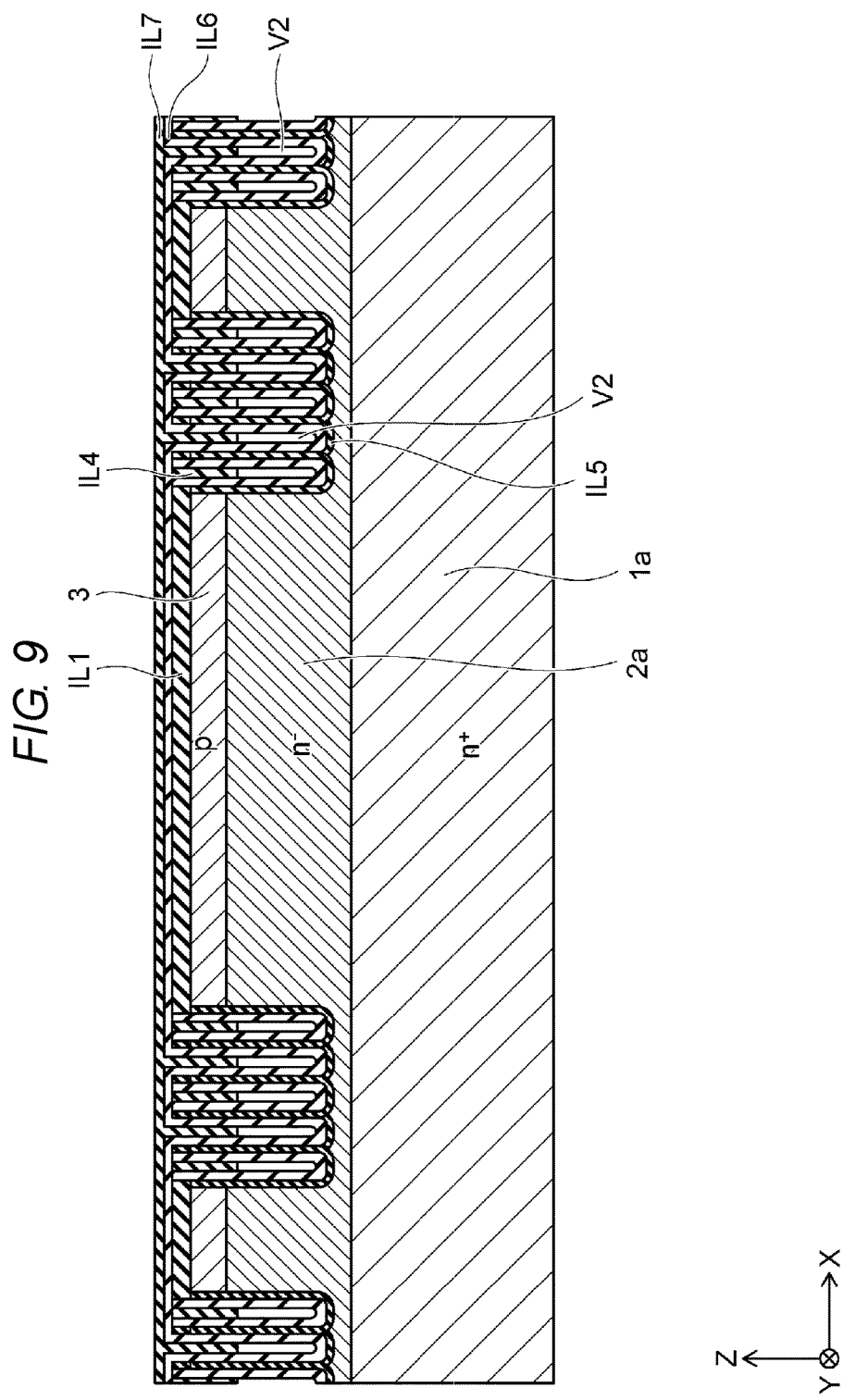
FIG. 9 is a cross-sectional view illustrating a step in the process of manufacturing the semiconductor device according to the first embodiment.

Next, an insulating layer IL6 including a silicon oxide is formed inside the second opening OP2 along the insulating layers IL2 and IL5 by a CVD method. The insulating layer IL6 is formed without, for example, an n type impurity and a p-type impurity added thereto. Subsequently, an insulating layer including BPSG is formed on the insulating layer IL6 by a CVD method. Subsequently, an insulating layer IL7 (fourth insulating layer) is formed by making the insulating layer reflow. At this time, the insulating layer IL7 is formed so as to cover the second opening OP2 without filling the second opening OP2. As a result, as illustrated in FIG. 9, a void V2 is formed between the insulating layer IL6 and the insulating layer IL7.

Figure 10:
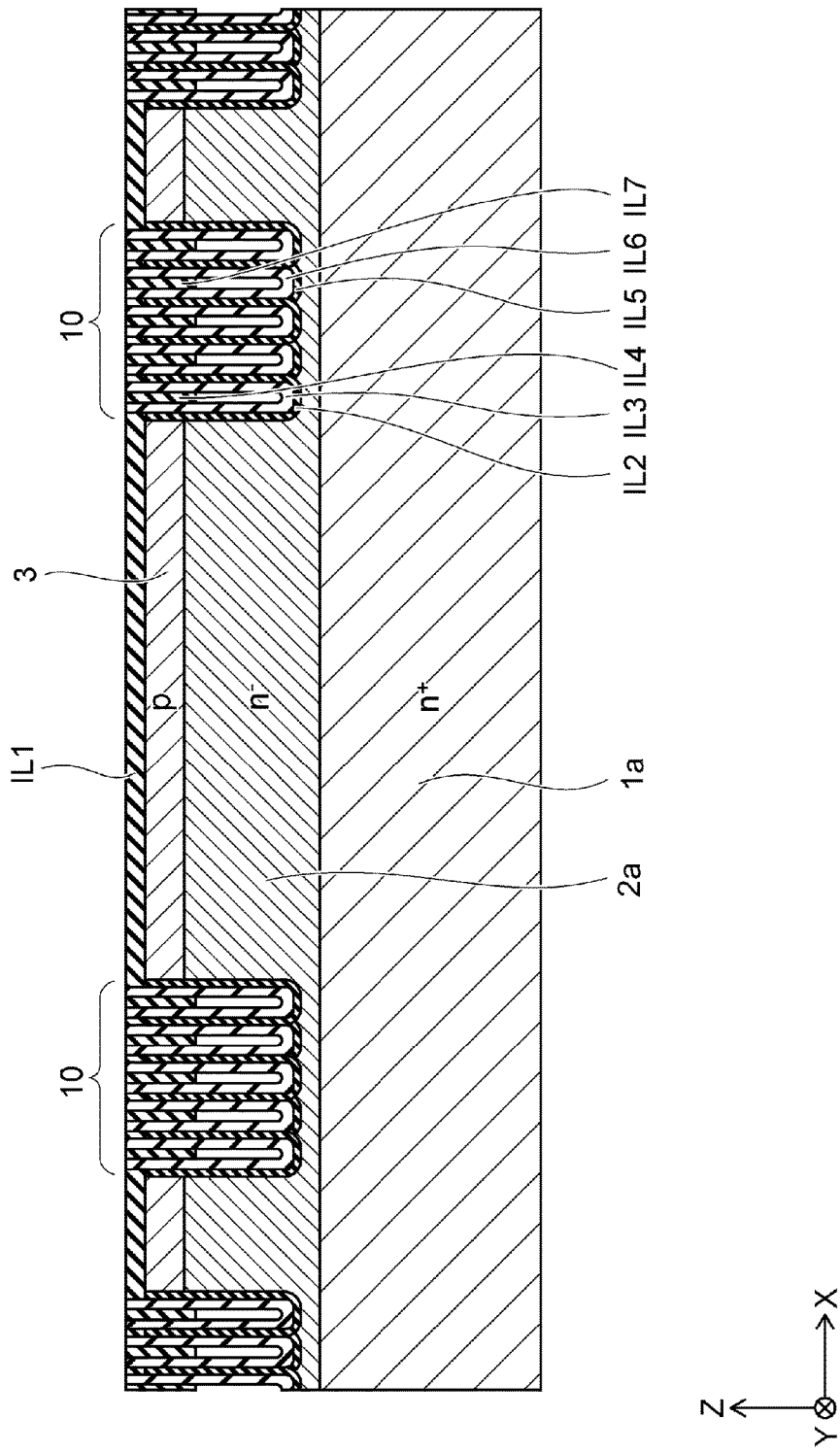
FIG. 10 is a cross-sectional view illustrating a step in the process of manufacturing the semiconductor device according to the first embodiment.

Next, the upper surface of the insulating layer IL7 is polished by a CMP method. The thickness of the insulating layer to be polished is arbitrary. For example, a portion of the insulating layer IL6 and a portion of the insulating layer IL7 are removed by this process. A state at this time is illustrated in FIG. 10. As illustrated in FIG. 10, the insulating portions 10 illustrated in FIGS. 1 to 3 includes the insulating layers IL2 to IL7.

Next, a portion of the insulating layer IL1 is removed. By this process, a portion of the p-type semiconductor region 3 surrounded by the insulating portion 10 is exposed, and the p-type semiconductor region 3 located in the vicinity of the insulating portion 10 is exposed.

Next, p type impurities are ion-implanted into a portion of the p-type semiconductor region 3 surrounded by the insulating portion 10, thereby forming the $p^+$ type anode region 4. At this time, p type impurities may be ion-implanted into the p-type semiconductor region 3 located in the vicinity of the insulating portion 10. This is because the region is removed in a process of removing a portion of the p-type semiconductor region 3 and a portion of the $n^-$ type semiconductor layer 2a, which is to be described later.

Figure 11:
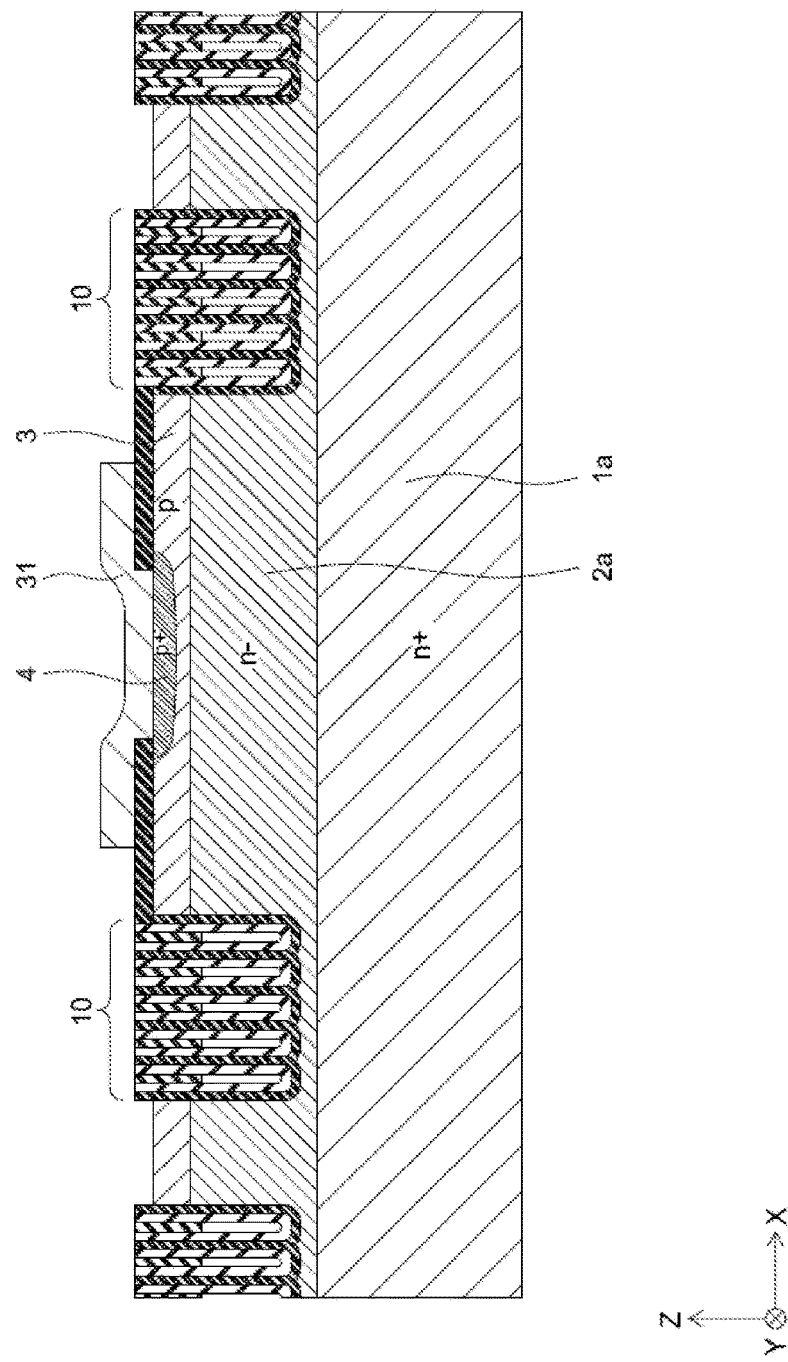
FIG. 11 is a cross-sectional view illustrating a step in the process of manufacturing the semiconductor device according to the first embodiment.

Subsequently, a metal layer is formed on the $p^+$ type anode region 4, and the metal layer is patterned, thereby forming the anode electrode 31 as illustrated in FIG. 11.

Figure 12:
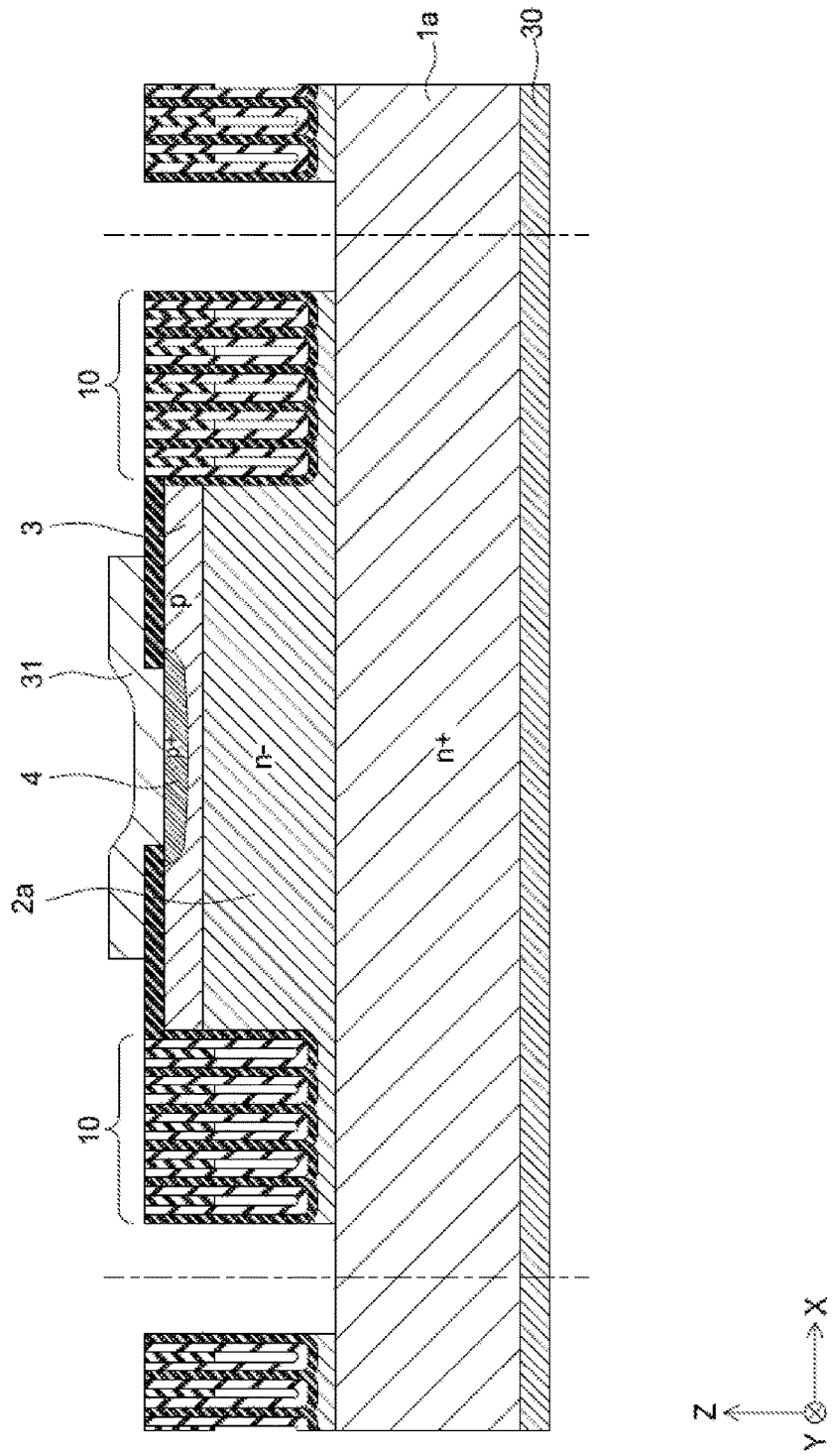
FIG. 12 is a cross-sectional view illustrating a step in the process of manufacturing the semiconductor device according to the first embodiment.

Next, the p-type semiconductor region 3 and the $n^-$ type semiconductor layer 2a which are located in the vicinity of the annular insulating portion 10 are removed using a photolithography and an RIE method. Subsequently, the rear surface of the $n^+$ type semiconductor layer 1a is polished until the $n^+$ type semiconductor layer 1a has a predetermined thickness. The cathode electrode 30 is formed by forming a metal layer on the rear surface of the polished $n^+$ type semiconductor layer 1a, as illustrated in FIG. 12. Finally, the $n^+$ type semiconductor layer 1a is divided at a position indicated by dashed lines of FIG. 12, thereby obtaining the semiconductor device 100 illustrated in FIGS. 1 to 3.

In the above-described manufacturing method, the density of the silicon oxide in the insulating layer formed by oxidizing the semiconductor layer including single crystal silicon is higher than the density of the silicon oxide in the insulating layer formed by a CVD method. For this reason, the density of the silicon oxide in the insulating layer IL2 is higher than the density of the silicon oxide in the insulating layer IL3, and is higher than the density of the silicon oxide in the insulating layer IL4. Similarly, the density of the silicon oxide in the insulating layer IL5 is higher than the density of the silicon oxide in the insulating layer IL6, and is higher than the density of the silicon oxide in the insulating layer IL7. In FIG. 10, the insulating layers IL3, IL4, IL6, and IL7 are equivalent to the first insulating portion 11, and the insulating layers IL2 and IL5 are equivalent to the second insulating portion 12.

In addition, the insulating layers IL3 and IL6 are formed without a group 13 element and a group 15 element added thereto, while the insulating layers IL4 and IL7 are formed by making an insulating layer including BPSG to reflow. For this reason, the concentration of the group 13 element and the group 15 element in the insulating layer IL4 is higher than the concentration of the elements in the insulating layer IL3. In addition, the concentration of the group 13 element and the group 15 element in the insulating layer IL7 is higher than the concentration of these elements in the insulating layer IL6. In FIG. 10, the insulating layers IL3 and IL6 are equivalent to the first insulating region 11a, and the insulating layers IL4 and IL7 are equivalent to the second insulating region 11b.

Here, operations and effects of the semiconductor device according to the present embodiment will be described.

In the semiconductor device according to the present embodiment, the insulating portion 10 is provided in the vicinity of the $n^-$ type semiconductor region 2 and the p-type semiconductor region 3 so as to come into contact with the semiconductor regions, and the insulating portion 10 has the plurality of voids V.

When the insulating portion 10 is provided in the vicinity of the $n^-$ type semiconductor region 2 and the p-type semiconductor region 3 so as to come into contact with the semiconductor regions, a pn junction plane expands along an X-Y plane and is terminated at the insulating portion 10. For this reason, it is possible to suppress electric field concentration due to the bending of the pn junction plane between the $n^-$ type semiconductor region 2 and the p-type semiconductor region 3.

Further, the insulating portion 10 has the plurality of voids V surrounding the $n^-$ type semiconductor region 2, and thus it is possible to reduce the bending of equipotential lines in the vicinity of an end of the pn junction plane in the insulating portion 10. For this reason, it is possible to further suppress electric field concentration in an end of the pn junction plane and to improve the breakdown voltage of the semiconductor device.

Next, effects of a method of manufacturing the semiconductor device according to the present embodiment will be described.

When external charge is present outside the insulating portion 10, the breakdown voltage of the semiconductor device may fluctuate. In order to sufficiently suppress the fluctuation in the breakdown voltage due to the external charge, it is preferable that the thickness of the insulating portion 10 in the second direction is large. As a method of forming the insulating portion 10, it is considered that the insulating portion 10 is formed by forming an annular opening having a large width and embedding an insulating layer in the opening. However, it is difficult to embed the insulating layer in the opening having a large width, and a long processing time is required until the embedding is completed.

On the other hand, in the method of manufacturing the semiconductor device according to the present embodiment, the plurality of annular first openings OP1 are formed, an insulating portion is formed inside each of the first openings OP1, the plurality of annular second openings OP2 are formed between the first openings OP1, and an insulating portion is formed inside each of the second openings OP2. It is possible to reduce the width of the opening for forming the insulating portion 10 by adopting the method, and thus the insulating portion is easily formed in each of the openings. Additionally, the thickness of the insulating portion 10 in the X and Y directions can be increased by increasing the number of first openings OP1 and the number of second openings OP2. For this reason, according to the present embodiment, it is possible to facilitate the formation of the insulating portion inside the opening and to easily make the insulating portion 10 be thick in the X and Y directions.

Meanwhile, in the manufacturing method illustrated in FIGS. 4 to 12, a plurality of insulating layers are formed inside the first opening OP1 and the second opening OP2. However, the exemplary embodiment is not limited to this example. Even when the insulating portion 10 is manufactured by forming a single insulating layer inside each of the openings, it is possible to obtain effects of the manufacturing method according to the present embodiment.

In addition, in the manufacturing method illustrated in FIGS. 4 to 12, the void V1 is formed in the opening OP1 by forming the insulating layer IL4 and the void V2 is formed in the opening OP2 by forming the insulating layer IL7. However, the process of manufacturing a semiconductor device according to the this embodiment is not limited to this example, and each of the insulating films may be formed so as to fill the inside of the openings. Even if a wider width opening is formed and the width opening is filled by an insulating film, it is possible to easily form the insulating portion 10.

First Modification Example

Figure 13:
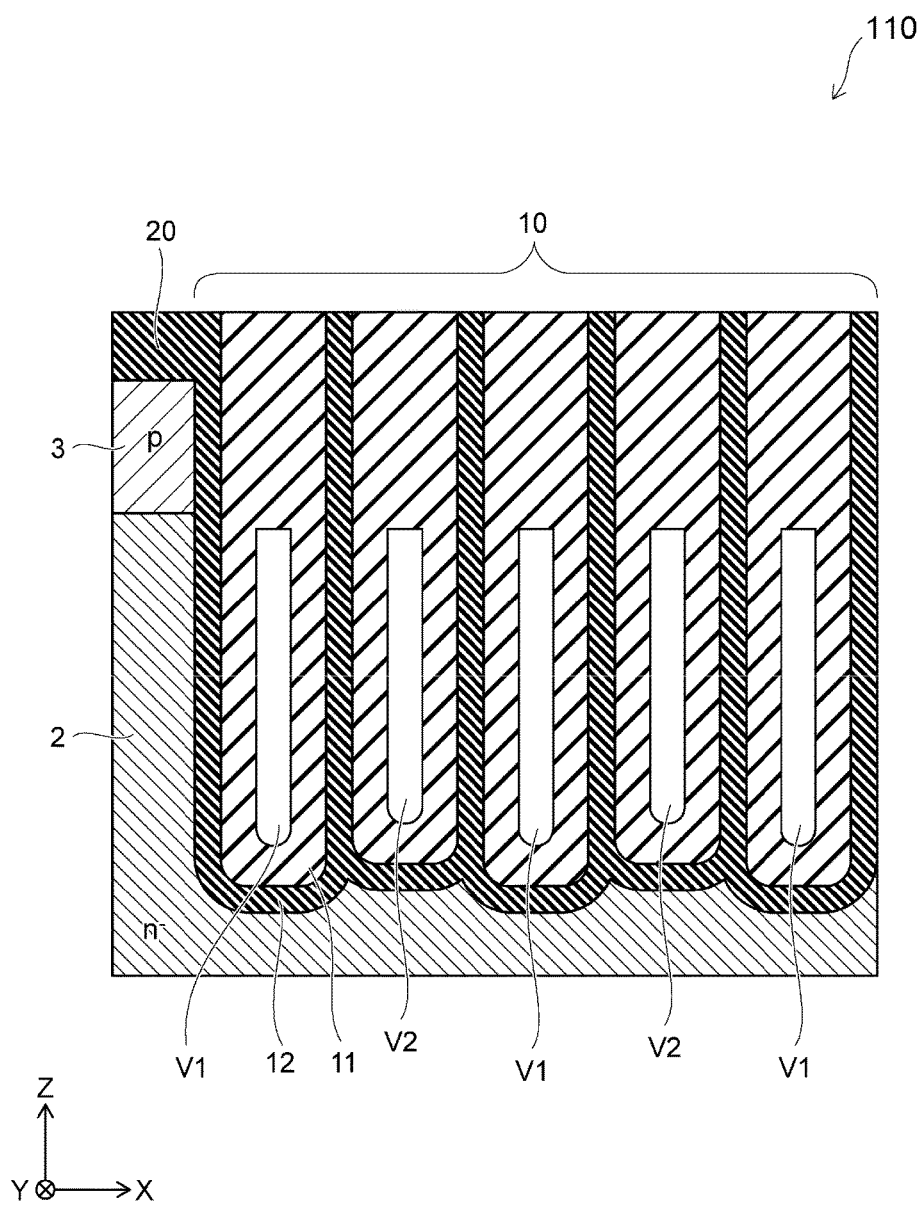
FIG. 13 is a partially enlarged cross-sectional view of a semiconductor device according to a first modification example of the first embodiment.

An insulating portion 10 may have a structure illustrated in FIG. 13.

FIG. 13 is a partially enlarged cross-sectional view of a portion of a semiconductor device 110 according to a first modification example of the first embodiment.

In the insulating portion 10 illustrated in FIG. 13, the depth of each of some of a plurality of first insulating portions 11 is different from the depth of each of the other first insulating portions 11. That is, a distance between each of some of the first insulating portions 11 and a cathode electrode 30 in a Z-direction is different from a distance between each of the other first insulating portions 11 and the cathode electrode 30 in the Z-direction. In addition, the position of a lower end of a void V1 included in each of some of the first insulating portions 11 is different from the position of a lower end of a void V2 included in each of the other first insulating portions 11.

Some of the first insulating portions 11 and the other first insulating portions 11 are alternately provided in a second direction.

Such a structure is formed by making conditions, such as the amount of etching and an etching rate during the formation of a second opening OP2, different from conditions during the formation of a first opening OP1. Alternatively, the structure may be formed by variations such as the amount of etching and an etching rate during the formation of the first opening OP1 and the second opening OP2.

Second Modification Example

Figure 14:
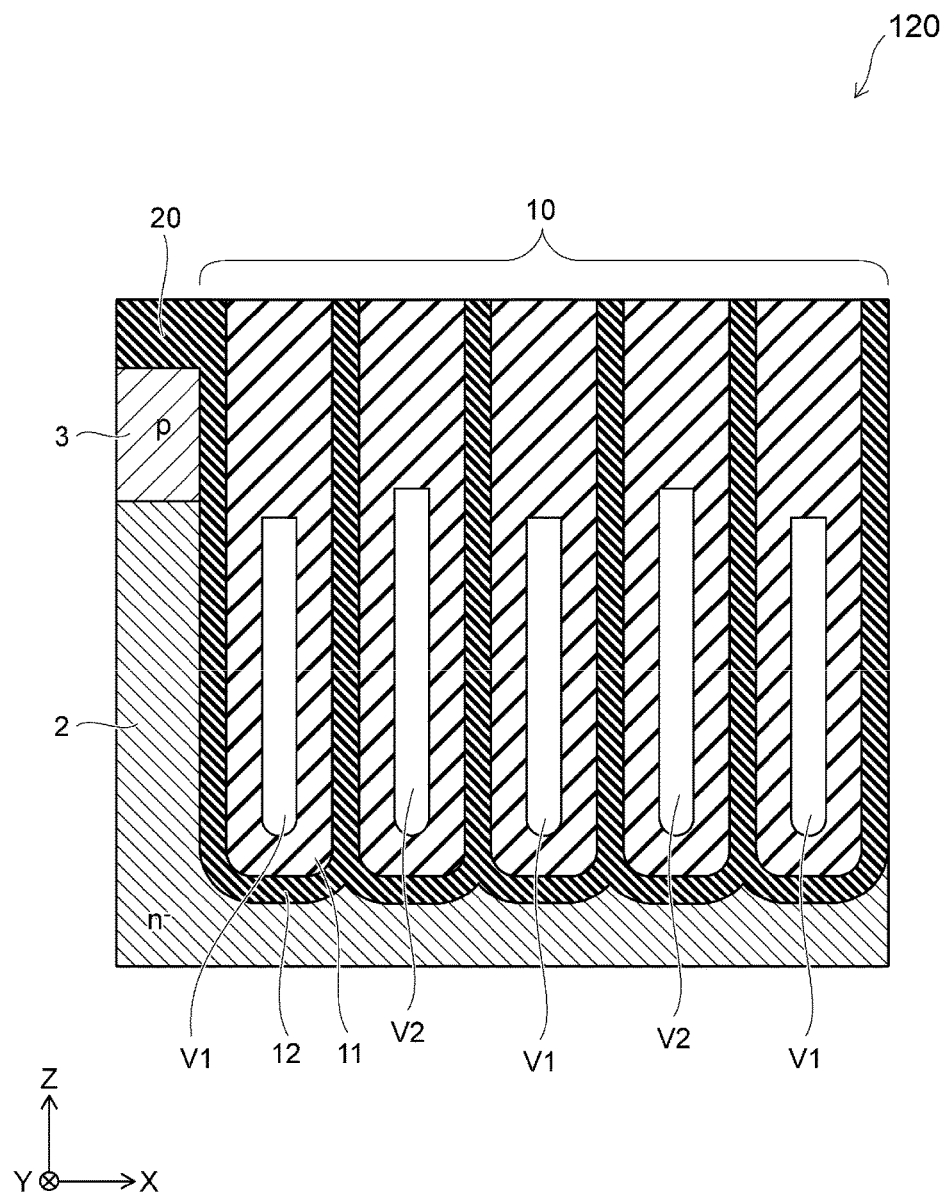
FIG. 14 is a partially enlarged cross-sectional view of a semiconductor device according to a second modification example of the first embodiment.

Alternatively, an insulating portion 10 may have a structure illustrated in FIG. 14.

FIG. 14 is a partially enlarged cross-sectional view of a portion of a semiconductor device 120 according to a second modification example of the first embodiment.

The insulating portion 10 illustrated in FIG. 14 has a plurality of first voids V1 and a plurality of second voids V2. The upper end of the first void V1 is located at a position deeper than the upper end of the second void V2. The position of the lower end of the first void V1 may be the same as or different from the position of the lower end of the second void V2. The voids V1 and V2 are alternately provided in a second direction. Meanwhile, either the first void V1 or the second void V2 may be located at the outermost circumference and the innermost circumference of the insulating portion 10.

The insulating portion 10 is manufactured by the following method.

First, after the process illustrated in FIGS. 4 to 6 is performed, polishing is performed so that only a portion of an insulating layer IL4 is removed or a portion of an insulating layer IL3 and only the insulating layer IL4 are removed. Thereafter, the process illustrated in FIGS. 7 to 9 is performed, thereby forming insulating layers IL5 to IL7.

According to such a method, the position of the upper surface of the insulating layer IL6 during the formation of the insulating layer IL7 becomes higher than the position of the upper surface of an insulating layer IL1 during the formation of the insulating layer IL4. As a result, the position of the upper end of a void formed when a second opening OP2 is covered with the insulating layer IL7 becomes higher than the position of the upper end of a void which is previously formed.

Also in the first and second modification examples described above, the same effects described in the first embodiment can be obtained.

In addition, the insulating portion 10 may have a structure obtained by combining the first modification example and the second modification example.

Second Embodiment

A semiconductor device 200 according to a second embodiment will be described with reference to FIG. 15.

Figure 15:
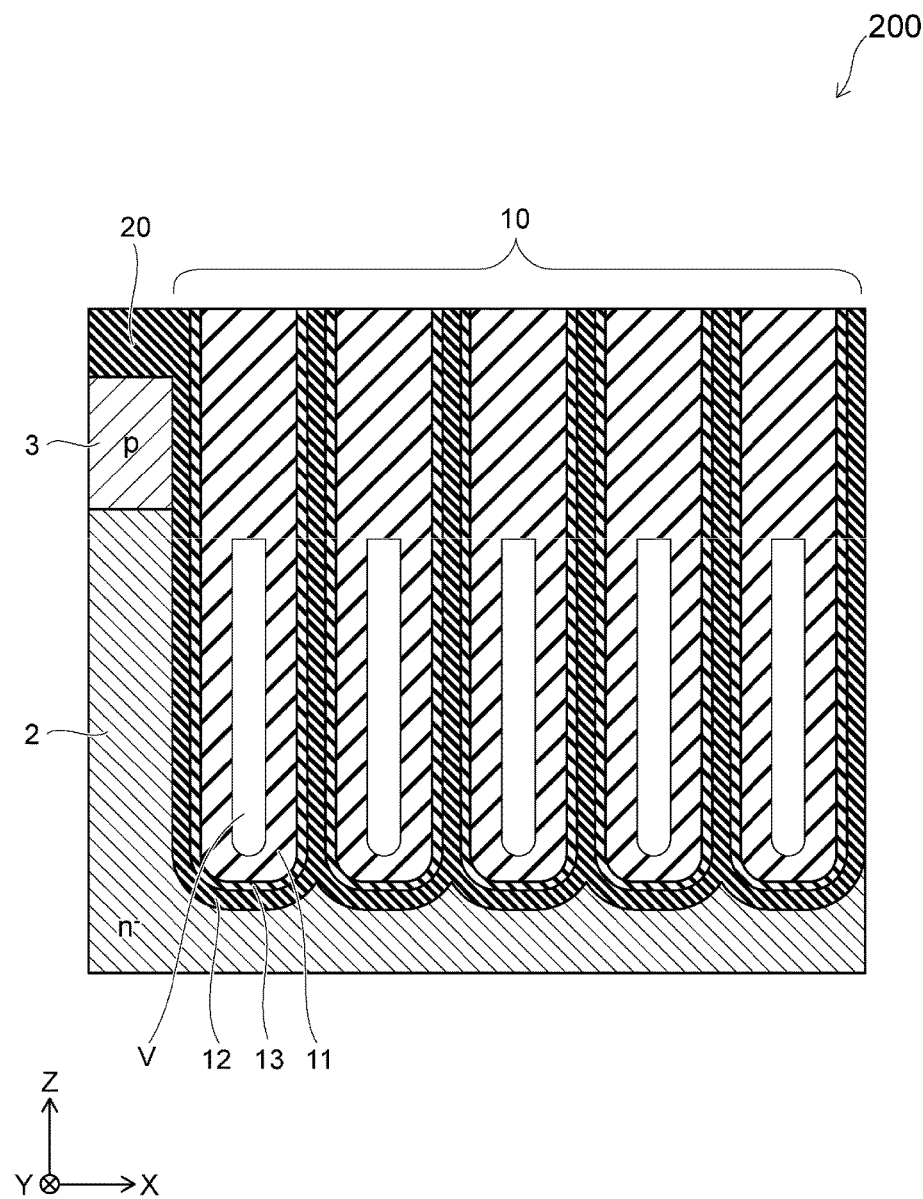
FIG. 15 is a partially enlarged cross-sectional view of a portion of a semiconductor device according to a second embodiment.

FIG. 15 is a partially enlarged cross-sectional view of a portion of the semiconductor device 200 according to the second embodiment.

The semiconductor device 200 is different from the semiconductor device 100 in terms of the structure of an insulating portion 10. In the present embodiment, the insulating portion 10 includes a third insulating portion 13 in addition to a first insulating portion 11 and a second insulating portion 12. The plurality of third insulating portions 13 are provided in a second direction. Each of the third insulating portions 13 is provided between the second insulating portion 12 and each of the first insulating portions 11.

The third insulating portion 13 includes a nitride. For example, the first insulating portion 11 and the second insulating portion 12 include an oxide of a semiconductor material, and the third insulating portion 13 includes a nitride of the semiconductor material.

The third insulating portion 13 includes a nitride, and thus has a passivation property higher than those of the first insulating portion 11 and the second insulating portion 12 which include oxide.

The insulating portion 10 includes the third insulating portion 13, and thus it is possible to suppress the entrance of impurities such as moisture from the outer circumference of the insulating portion 10 toward the inner circumference thereof. Further, in the semiconductor device 200, the plurality of third insulating portions 13 are provided in the second direction, and thus it is possible to further improve a passivation property.

The third insulating portion 13 may not be provided between the second insulating portion 12 and all of the first insulating portions 11. That is, the third insulating portion 13 may be provided between the second insulating portion 12 and at least two first insulating portions 11.

The insulating portion 10 is manufactured by forming an insulating layer including a nitride after an insulating layer IL2 is formed and before an insulating layer IL3 is formed, for example, in the process illustrated in FIG. 6. Alternatively, after the insulating layer IL3 is formed and before the insulating layer IL4 is formed, an insulating layer including a nitride may be formed.

Alternatively, the insulating portion 10 may be manufactured by forming an insulating layer including a nitride after an insulating layer IL5 is formed and before an insulating layer IL6 is formed, for example, in the process illustrated in FIG. 9. Alternatively, after the insulating layer IL6 is formed and before an insulating layer IL7 is formed, an insulating layer including a nitride may be formed.

Alternatively, an insulating layer including a nitride may be formed in both the process illustrated in FIG. 6 and the process illustrated in FIG. 9.

Third Embodiment

A semiconductor device 300 according to a third embodiment will be described with reference to FIGS. 16 and 17.

Figure 16:
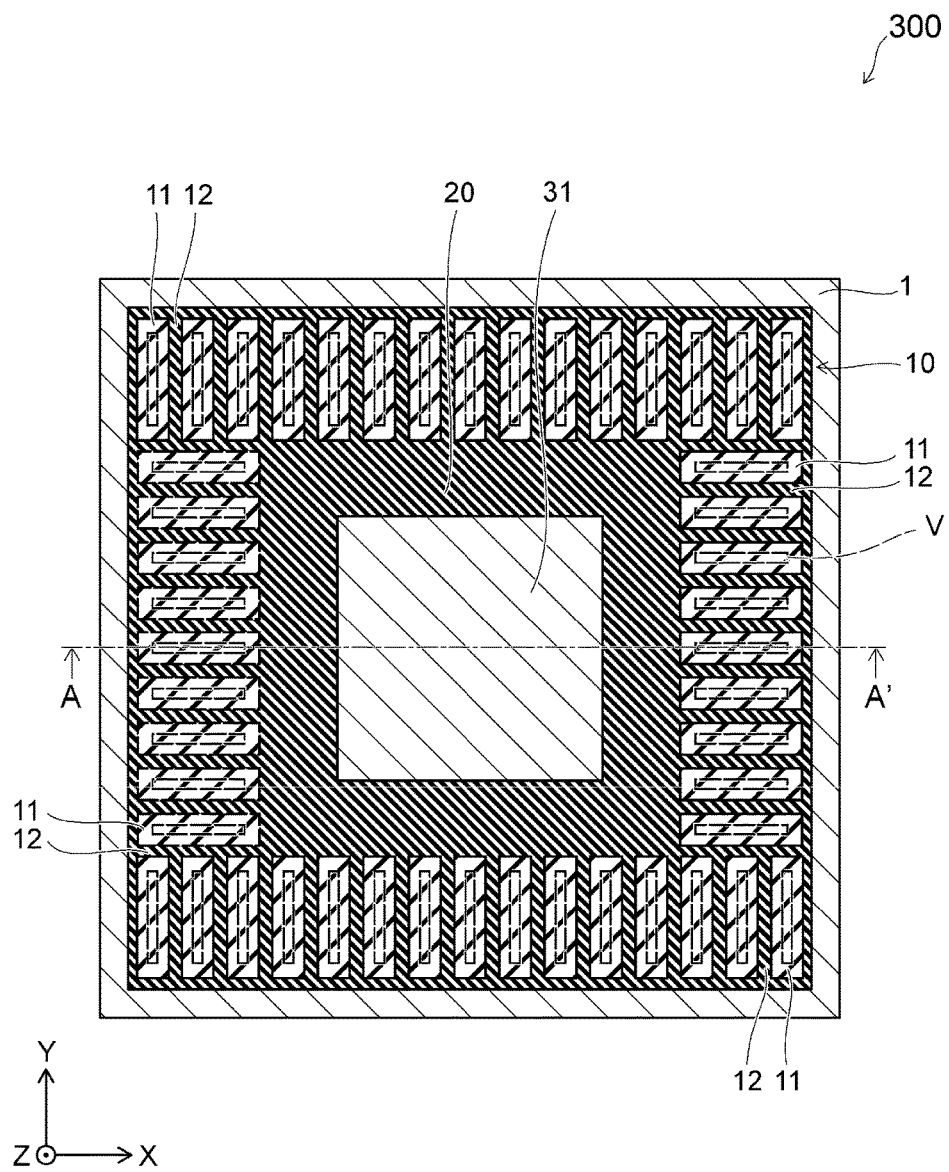
FIG. 16 is a plan view of a semiconductor device according to a third embodiment.

FIG. 16 is a plan view of the semiconductor device 300 according the third embodiment.

Figure 17:
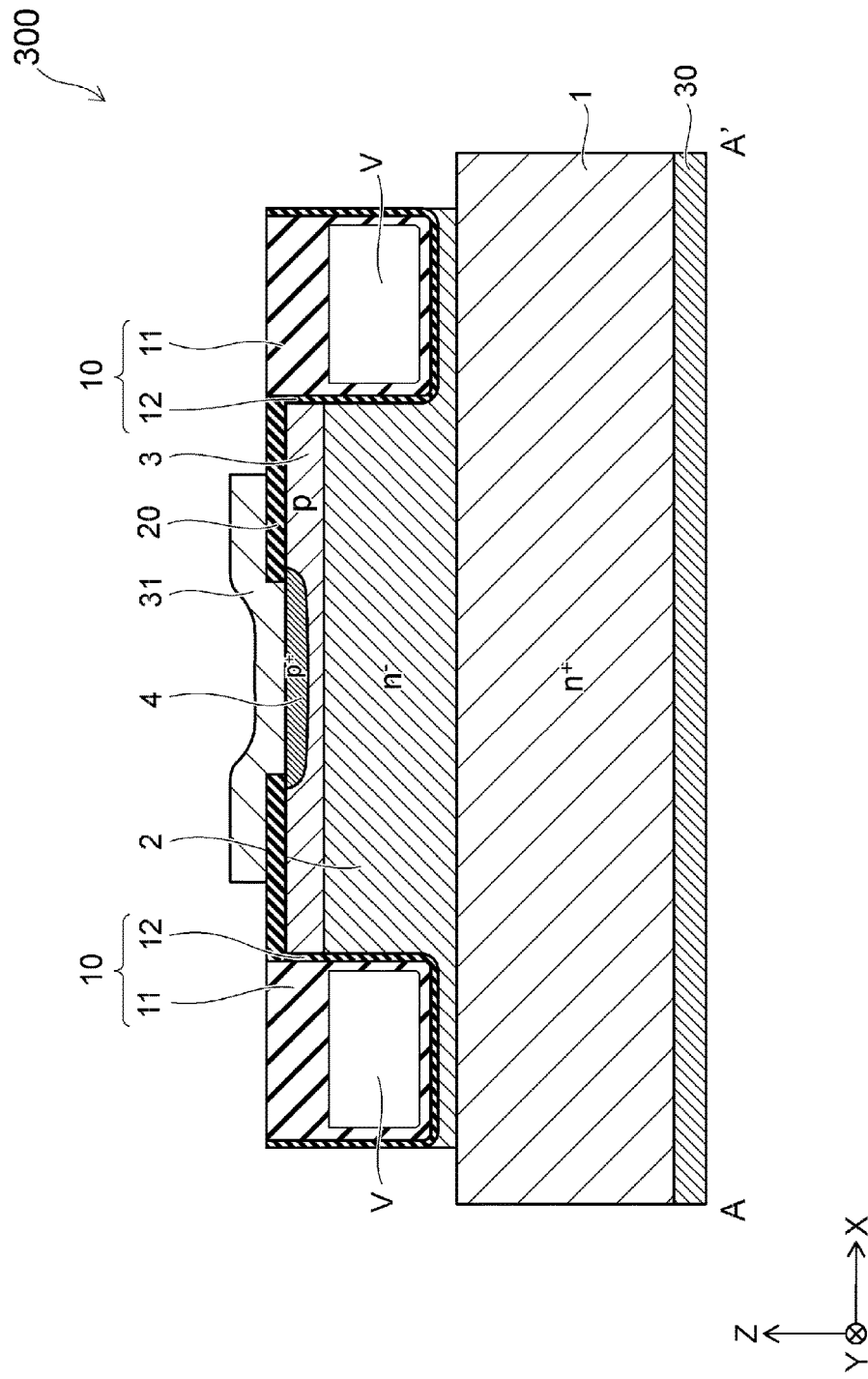
FIG. 17 is a cross-sectional view taken along line A-A' of FIG. 16.

FIG. 17 is a cross-sectional view taken along line A-A' of FIG. 16.

The semiconductor device 300 is different from the semiconductor device 100 in terms of the structure of an insulating portion 10. In the semiconductor device 100, the plurality of first insulating portions 11 extend in the X and Y directions. On the other hand, in the present embodiment, a plurality of first insulating portions 11 are aligned in a circumferential direction in the vicinity of an n⁻ type semiconductor region 2 and a p-type semiconductor region 3, i.e., each void extends in either the X or the Y direction. Similarly, a plurality of voids included in the first insulating portions 11 are aligned in the circumferential direction.

The semiconductor device 300 is manufactured, for example, by the following method.

First, a plurality of first openings OP1 aligned in the circumferential direction are formed in the vicinity of a portion of an n⁻ type semiconductor layer 2a and a portion of a p-type semiconductor region 3. Subsequently, similarly to the process illustrated in FIG. 6, an insulating portion is formed inside each of the first openings OP1. Subsequently, a second opening OP2 is formed between the insulating portions. Similarly, the second openings OP2 are aligned in the circumferential direction in the vicinity of a portion of the n⁻ type semiconductor layer 2a and a portion of the p-type semiconductor region 3. Subsequently, similar to FIGS. 8 and 9, an insulating portion is formed inside each of the second openings OP2. Thereafter, similar to FIGS. 10 to 12, the semiconductor device 300 is obtained by forming other components.

In the semiconductor device according to the present embodiment, the plurality of voids V surround the n⁻ type semiconductor region 2, and thus it is possible to suppress electric field concentration in an end of a pn junction plane and to improve the breakdown voltage of the semiconductor device, similar to the first embodiment.

In addition, according to a method of manufacturing the semiconductor device according to the present embodiment, the thickness of the insulating portion 10 in the second direction can be enlarged by increasing the length of each of the first opening OP1 and the second opening OP2 in the second direction. For this reason, according to a method of manufacturing the semiconductor device according to the present embodiment, it is possible to facilitate the formation of an insulating portion inside an opening and to easily increase the thickness of the insulating portion 10 in the second direction, similarly to the first embodiment.

Fourth Embodiment

A semiconductor device 400 according to a fourth embodiment will be described with reference to FIG. 18.

Figure 18:
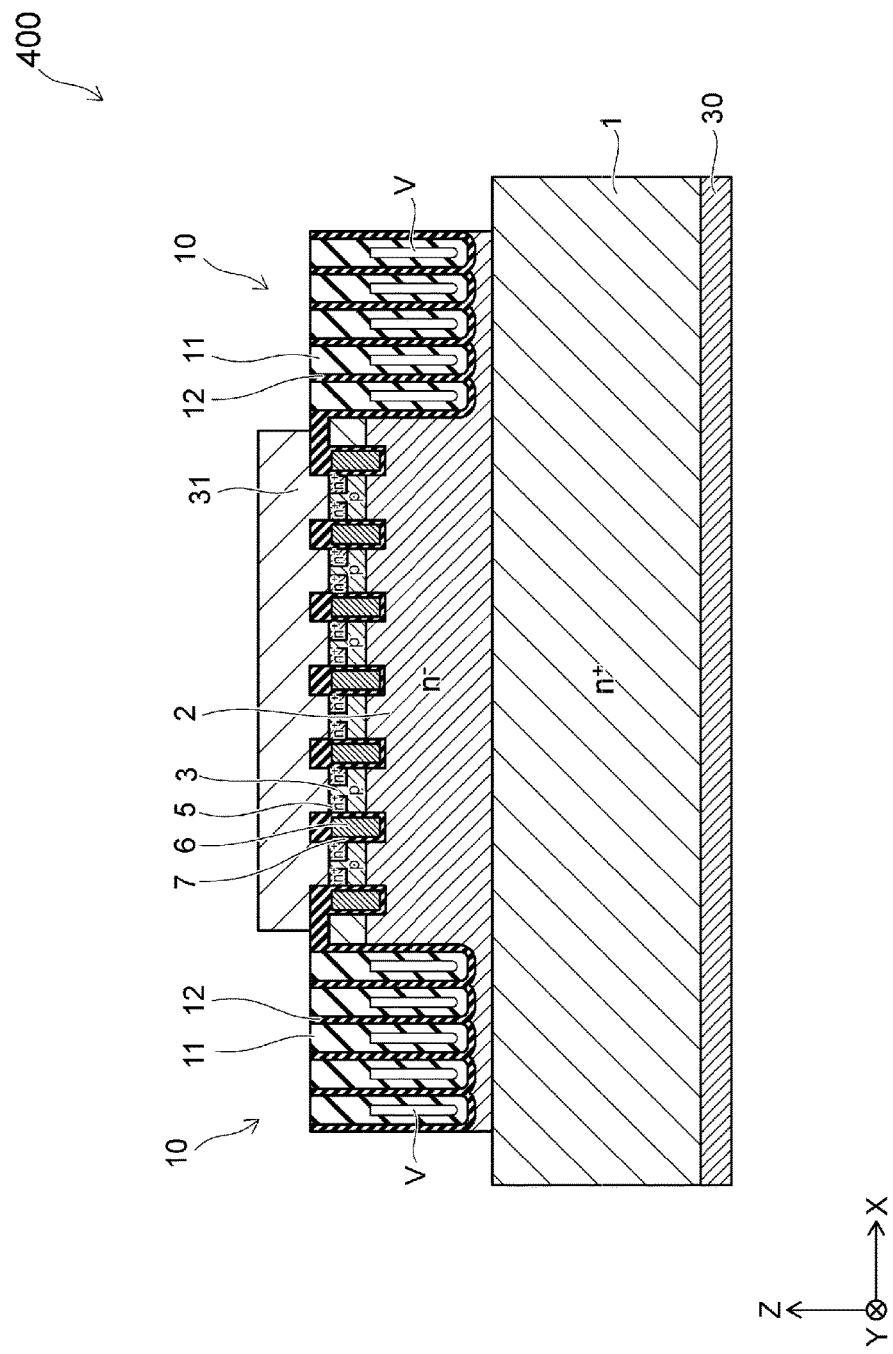
FIG. 18 is a cross-sectional view of a semiconductor device according to a fourth embodiment.

FIG. 18 is a cross-sectional view of the semiconductor device 400 according to the fourth embodiment.

The semiconductor device 400 is, for example, a metal oxide semiconductor field effect transistor (MOSFET).

In the semiconductor device 400, an n⁺ type semiconductor region 1 functions as a drain region, and a p-type semiconductor region 3 functions as a base region. In addition, an electrode 30 functions as a drain electrode, and an electrode 31 functions as a source electrode.

As illustrated in FIG. 18, the semiconductor device 400 includes the n⁺ type drain region 1 (first semiconductor region), an n⁻ type semiconductor region 2 (second semiconductor region), the p-type base region 3 (third semiconductor region), an n⁺ type source region 5 (fifth semiconductor region), a gate electrode 6, a gate insulation layer 7, an insulating portion 10, the drain electrode 30, and the source electrode 31.

The n⁺ type source region 5 is selectively provided on the p-type base region 3.

The gate insulation layer 7 is provided between the gate electrode 6 and each of the n⁻ type semiconductor region 2, the p-type base region 3, and the n⁺ type source region 5.

The source electrode 31 is electrically connected to the p-type base region 3 and the n⁺ type source region 5.

The gate insulation layer 7 is provided between the source electrode 31 and the gate electrode 6, and the electrodes are electrically separated from each other.

In the semiconductor device according to the present embodiment, the insulating portion 10 comes into contact with the n⁻ type semiconductor region 2 and the p-type base region 3, and has a plurality of voids V surrounding the n⁻ type semiconductor region 2. For this reason, similar to the first embodiment, it is possible to suppress electric field concentration at an end of a pn junction plane and to improve the breakdown voltage of the semiconductor device.

In addition, it is also possible to apply the invention according to the fourth embodiment to an insulated gate bipolar transistor (IGBT). In this case, a p⁺ type semiconductor region is provided between the n⁺ type drain region 1 and the drain electrode 30.

Meanwhile, in the fourth embodiment, it is also possible to adopt the structure of the insulating portion 10 according to the first modification example or the second modification example. Alternatively, it is also possible to adopt the structure of the insulating portion 10 according to the second embodiment or the third embodiment.

Fifth Embodiment

A semiconductor device 500 according to a fifth embodiment will be described with reference to FIGS. 19 and 20.

Figure 19:
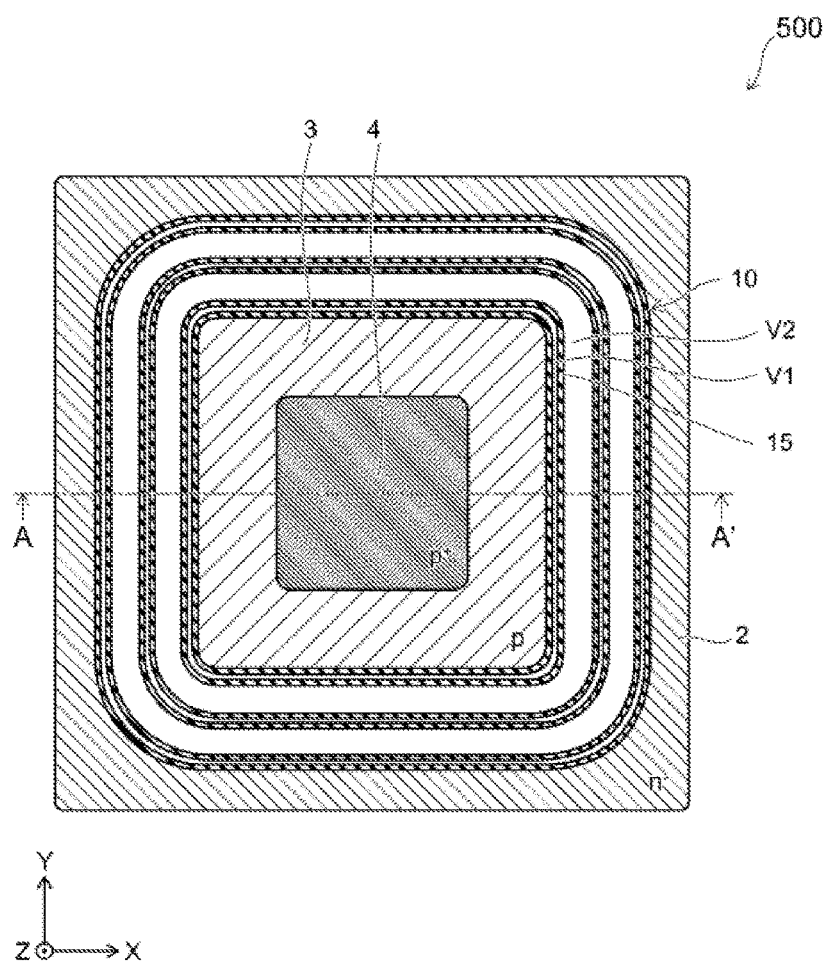
FIG. 19 is a plan view of a semiconductor device according to a fifth embodiment.

FIG. 19 is a plan view of a semiconductor device according to a fifth embodiment.

Figure 20:
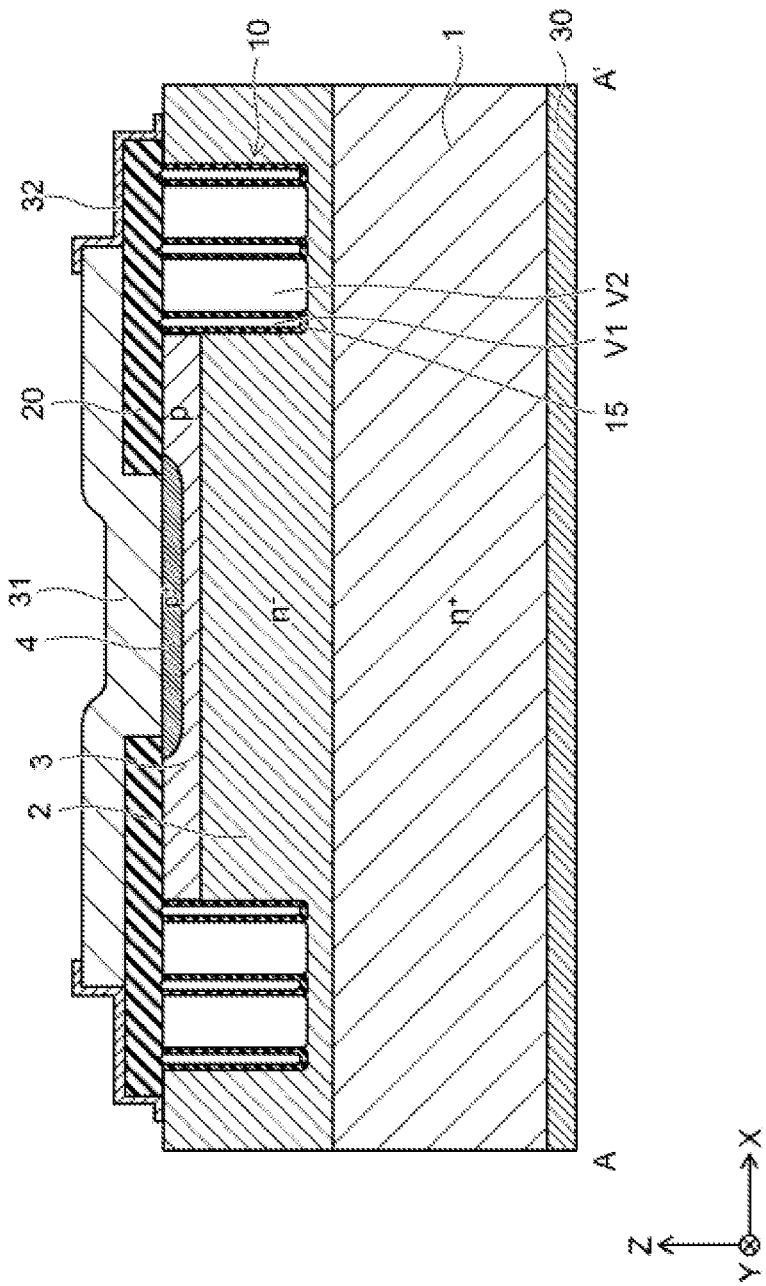
FIG. 20 is a cross-sectional view taken along line A-A' of FIG. 19.

FIG. 20 is a cross-sectional view taken along line A-A' of FIG. 19.

Meanwhile, in the view of the device 500 shown in FIG. 19, an insulating portion 20, an anode electrode 31, and a conductive layer 32 are omitted.

The semiconductor device 500 is different from the semiconductor device 100 in terms of the structure of an insulating portion 10, the insulating portion 20 and the anode electrode 31.

In addition, the semiconductor device 500 may have the conductive layer 32.

As illustrated in FIGS. 19 and 20, the insulating portion 10 includes a plurality of voids V1 and voids V2. The void V1 and the void V2 are bounded by the insulating film 15, an oxidized region 16 and the insulating portion 20.

The void V1 and the void V2 are provided in an annular shape, and surround a portion of an n⁻ type semiconductor region 2 and a p-type semiconductor region 3. The void V1 and the void V2 are sequentially provided in a second (radial) direction (direction from the center of the semiconductor device 500 toward the outer circumference thereof and they are concentrically arranged to surround a portion of the second semiconductor region 2, i.e., they extend in the X and the Y directions) which is perpendicular to the Z-direction. In addition, the width of the void V2 in the radial direction is wider than the width of the void V1 in the radial direction.

As illustrated in FIGS. 19 and 20, a portion of the n type semiconductor region 2 may be provided in the vicinity of the insulating portion 10.

Further, the insulating portion 10 may extend into the n⁺ type semiconductor region 1 and thus surround a portion thereof in addition to a portion of the n⁻ type semiconductor region 2 and a portion of the p-type semiconductor region 3.

The insulating portion 20 is provided on the insulating portion 10. And the void V1 and the void V2 are covered by the insulating portion 20. In addition, a portion of the insulating portion 20 is provided on the n⁻ type semiconductor region 2 provided in the vicinity of the insulating portion 10.

A portion of the anode electrode 31 is provided on the insulating portion 20 and is located on the insulating portion 10.

The conductive layer 32 is provided in the vicinity of the insulating portion 20 and the anode electrode 31, and connects the n⁻ type semiconductor region 2 provided in the vicinity of the insulating portion 10 and the anode electrode 31.

The conductive layer 32 include contains a semi-insulating material such as, for example, a silicon nitride having high resistance or polycrystalline silicon. The electric resistance of the conductive layer 32 is higher than the electric resistance of the n⁻ type semiconductor region 2, and is lower than the electric resistance of the insulating portion 20. For example, the electric resistance of the conductive layer 32 is not less than $1.0 \times 10^7$ Ω·cm and not more than $1.0 \times 10^{12}$ Ω·cm.

Here, an example of a method of manufacturing the semiconductor device 500 according to the fifth embodiment will be described with reference to FIGS. 21 to 24.

Figure 21:
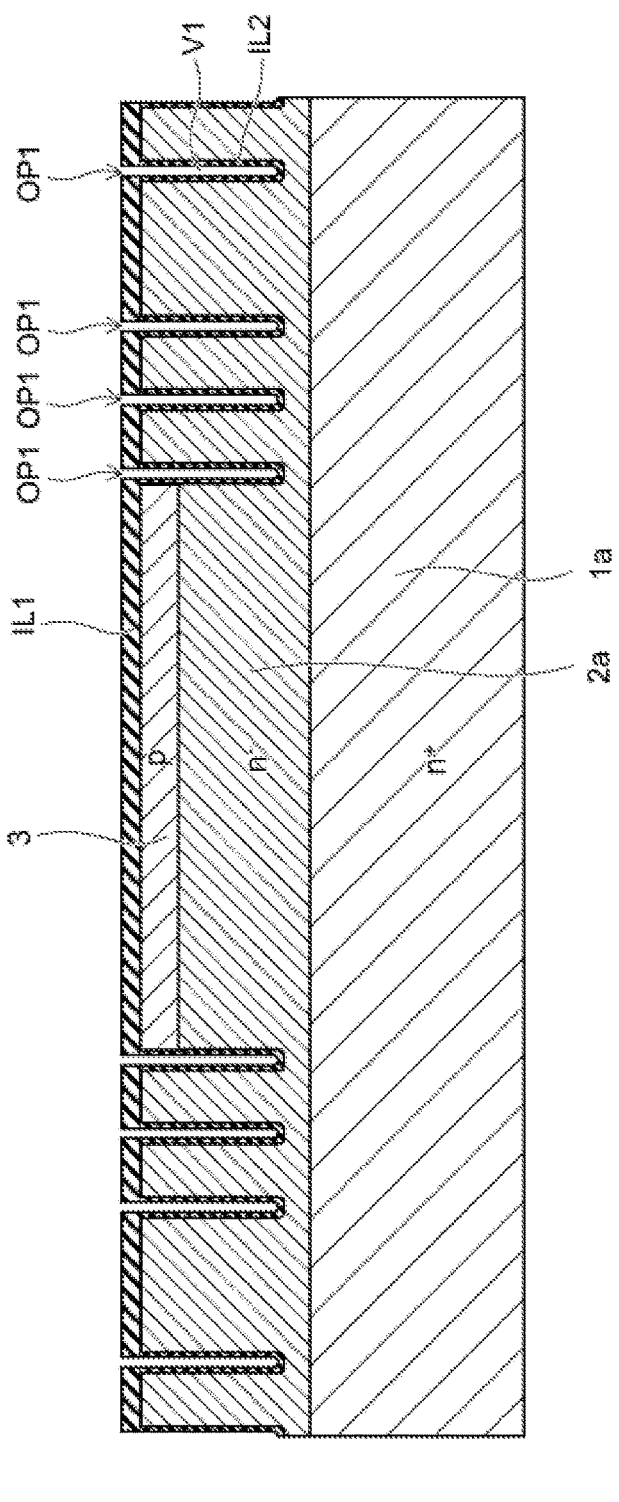
FIG. 21 is a cross-sectional view illustrating the result of a step in the process of manufacturing a semiconductor device according to the fifth embodiment.
Figure 22:
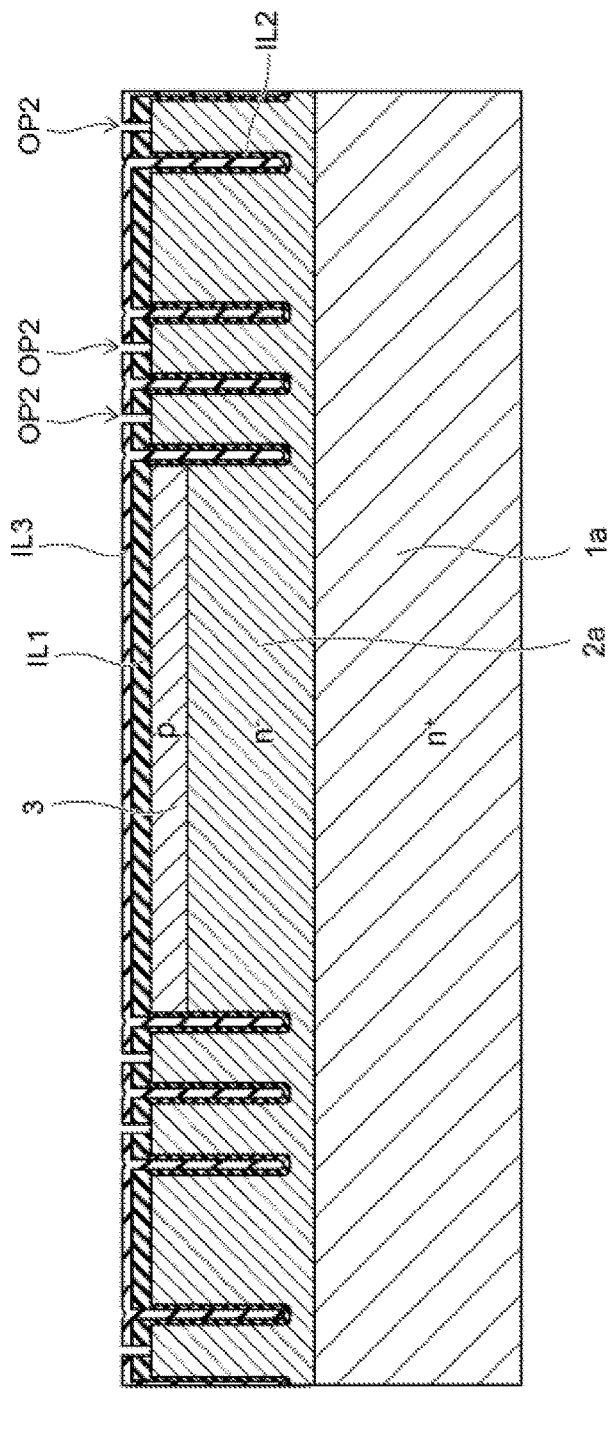
FIG. 22 is a cross-sectional view illustrating the result of a step in the process of manufacturing a semiconductor device according to the fifth embodiment.
Figure 24:
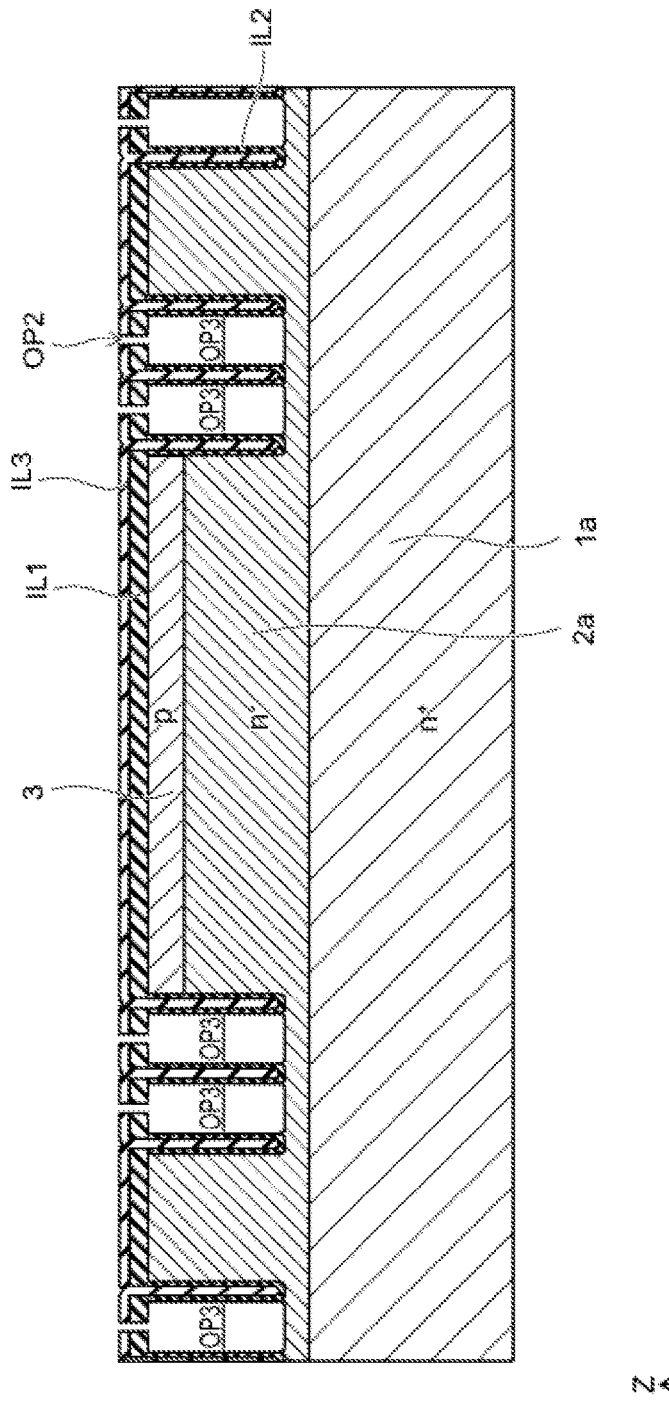
FIG. 24 is a cross-sectional view illustrating the result of a step in the process of manufacturing a semiconductor device according to the fifth embodiment.

FIGS. 21 and 22, 24 are cross-sectional views illustrating the results of steps in the process of manufacturing the semiconductor device 500 according to the fifth embodiment.

Figure 23:
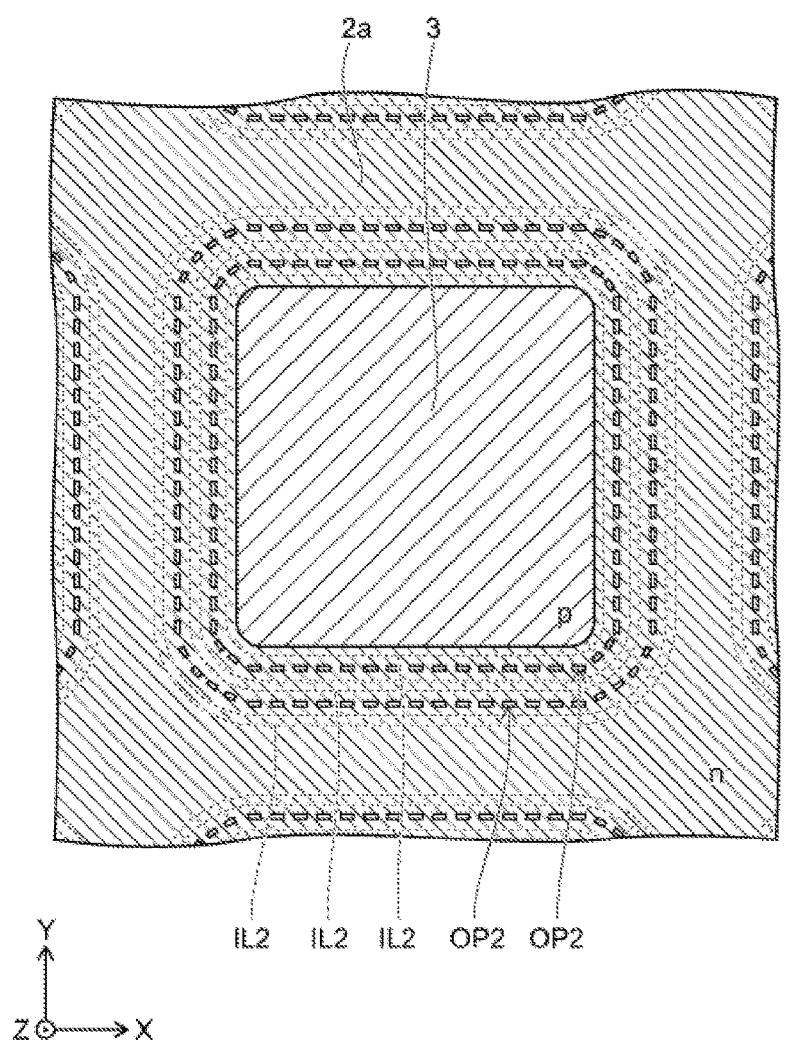
FIG. 23 is a plan view illustrating the result of a step in the process of manufacturing a semiconductor device according to the fifth embodiment.

FIG. 23 is a plan view illustrating the result of a step in the process of manufacturing a semiconductor device 500 according to the fifth embodiment. In FIG. 23, the insulating layer IL1 and the insulating layer IL3 are omitted and an outer edge of an insulating layer IL2 is indicated by a dashed line.

First, similarly to the process illustrated in FIG. 4, a plurality of first openings OP1 in a trench shape (first openings) are formed in the n⁻ type semiconductor region 2a using the patterned insulating layer IL1 as a mask. The first openings OP1 are formed in an annular shape. Next, the insulating layer IL2 (first insulating layer) is formed along the inner wall of the first opening OP1 by performing thermal oxidation, as illustrated in FIG. 21.

Next, the insulating layer IL3 is formed on the insulating layer IL2 and the first opening OP1 is closed. At this time, the first opening OP1 may be filled by the insulating layer IL3 or the void V1 may be formed between the insulating layer IL2 and the insulating layer IL3.

Next, a portion of the insulating layer IL1 and a portion of the insulating layer IL3 are removed, and thereby as illustrated in FIGS. 22 and 23 a plurality of second openings OP2 in a trench shape (second openings) are formed in the insulating layer IL1 and the insulating layer IL3.

Meanwhile, FIG. 22 shows that the first openings OP1 are filled by the insulating layer IL3.

As illustrated in FIG. 23, a plurality of second openings OP2 are formed between the insulating layers IL2. A plurality of second openings OP2 are aligned in a circumferential direction so as to surround a portion of the n⁻ type semiconductor region 2 and a portion of the p-type semiconductor region 3. As illustrated in FIG. 22, a portion of the n⁻ type semiconductor region 2a between the insulating layers IL2 is exposed via the second opening OP2. In addition, the insulating layer IL1 and the insulating layer IL3 are patterned so that a width of the second opening OP2 is smaller than a span of the n⁻ type semiconductor region 2a between the insulating layers IL2.

As an example, the second opening OP2 is formed in a rectangle shape so that a short side of the second opening OP2 in an X-Y plane is not more than 3 μm. Meanwhile, a pattern of the second openings OP2 is not limited to the example illustrated in FIG. 23. For example, a plurality of second openings OP2 may be formed in the second direction in a region between the insulating layers IL2.

Next, a portion of the n⁻ type semiconductor region 2a between the insulating layers IL2 is removed via the second openings OP2. At this time, it is possible to remove the n⁻ type semiconductor region 2a between the insulating layers IL2 by isotropic etching via the second openings OP2. In addition, by the isotropic etching using the insulating layers IL2 as a mask, it is possible to progress the etching in the lateral direction, and to prevent an occurrence of residues on a side surface of the insulating layers IL2. As illustrated in FIG. 24, a plurality of third openings OP3 (third openings) are thus formed between the insulating layers IL2 by this process.

Next, an insulating layer IL4 (third insulating layer) is formed on the insulating layer IL3. At this point, the second openings OP2 are closed by the insulating layer IL4 and the void V2 is formed.

Thereafter, similarly to the process illustrated in FIGS. 10 to 12, insulating layers IL1 and IL 3 are patterned to form insulating portion 20, a p⁺ type anode region 4, the anode electrode 31 and the cathode electrode 30 are serially formed and an n⁺ type semiconductor layer 1a is singulated, thereby obtaining the semiconductor device 500 illustrated in FIGS. 19 and 20.

The insulating portion 10 includes a plurality of voids V1 and a plurality of voids V2, and it is possible to suppress electric field concentration in an end of the pn junction plane and to improve the breakdown voltage of the semiconductor device 500 according to the present embodiment, similarly to the semiconductor device 100.

Further, specific inductive capacity (dielectric constant) in the void V1 and the void V2 is lower than specific inductive capacity (dielectric constant) of an insulating material such silicon oxide or silicon nitride. For this reason, the insulating portion 10 includes a plurality of voids V1 and a plurality of voids V2 in concentric rings as shown in FIG. 20, and it is possible to maintain the breakdown voltage of the semiconductor device 500 and to miniaturize the semiconductor device 500 by thinning the insulating portion 10.

Meanwhile, the insulating portion 10 is illustrated that the void V1 is included in the insulating films 15, but voids included by the insulating films 15 may be filled by an insulating material. Even in this case, the insulating portion 10 includes a plurality of the larger voids V2 in concentric rings, and it is possible to improve the breakdown voltage of a semiconductor device.

Further, a portion of the anode electrode 31 of the semiconductor device 500 according to the present embodiment is provided on the insulating portion 10. Therefore, it is possible to further suppress electric field concentration in an end of the pn junction plane and to improve the breakdown voltage of the semiconductor device 500.

Further, in the semiconductor device 500 according to the present embodiment, a conductive layer 32 is provided on the anode electrode 31 and the n⁻ type semiconductor region 2 provided in the vicinity of the insulating portion 10, and the conductive layer 32 electrically connects the anode electrode 31 and the n⁻ type semiconductor region 2. In a state in which a reverse voltage is applied to the semiconductor device 500, the electric potential of the n- type semiconductor region 2 provided in the vicinity of the insulating portion 10 is substantially equal to the electric potential of the cathode electrode 30. Therefore, even if the current does not flow through the n- type semiconductor region 2, a minute electric current will flow through the conductive layer 32 and the electric potential distribution is formed in the conductive layer 32.

At this time, the electric potential in the vicinity of the pn junction plane of the n⁻ type semiconductor region 2 and the p-type semiconductor region 3 changes depending on the electric potential distribution of the conductive layer 32. Therefore, by providing the conductive layer 32, it is possible to further suppress electric field concentration in an end of the pn junction plane.

Meanwhile, if a p type semiconductor region is substantially equal to the electric potential of the cathode electrode 30, the p type semiconductor region may be provided on the n⁻ type semiconductor region 2 and connected with the anode electrode 31 via the conductive layer 32.

In the method of manufacturing the semiconductor device according to the present embodiment, a plurality of second openings OP2 are aligned in the circumferential direction, and a portion of the n⁻ type semiconductor region 2a is removed via the second openings OP2.

According to such a method, the opening OP2 can easily be closed by the insulating layer IL4 and it is possible to easily form a wide void V2.

Meanwhile, in the process illustrated in FIGS. 22 to 23, if a plurality of second openings OP2 are aligned in the circumferential direction, the middle one of the insulating layers IL2 is not supported by the insulating layer IL1 and the insulating layer IL3 when the opening OP3 is formed. Therefore, the insulating layers IL2 may collapse.

In the method of manufacturing the semiconductor device according to the present embodiment, a plurality of second openings OP2 are aligned in the circumferential direction and separated from each other, and it is possible to suppress collapsing of the insulating layers IL2 when the opening OP3 is formed.

First Modification Example

Figure 25:
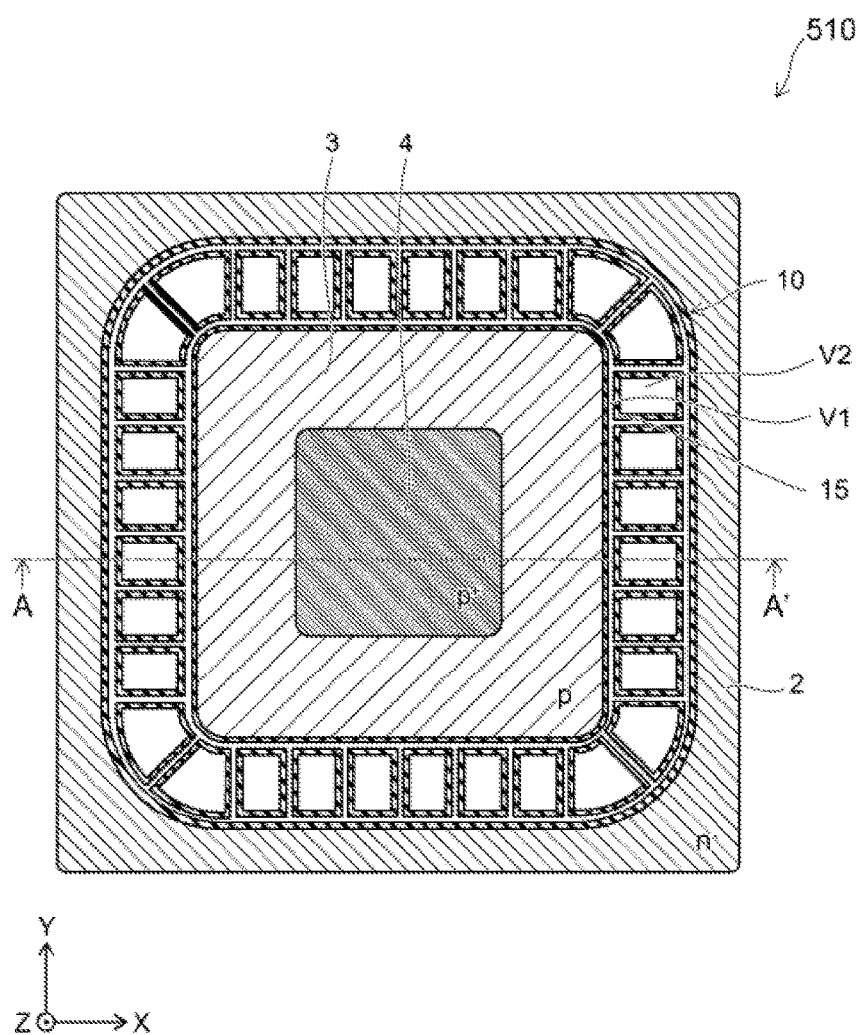
FIG. 25 is a plan view of a semiconductor device according to a first modification example of the fifth embodiment.

FIG. 25 is a plan view of a semiconductor device 510 according to a first modification example of the fifth embodiment.

Figure 26:
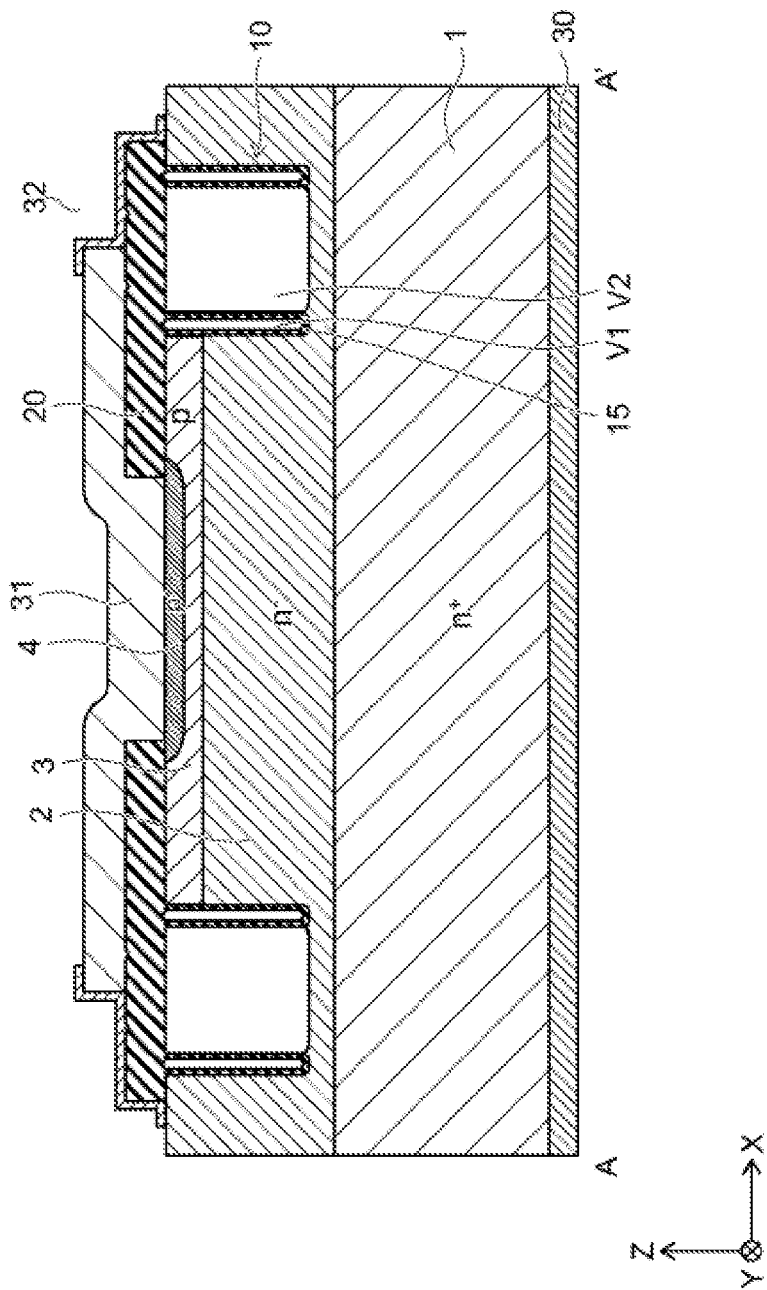
FIG. 26 is a cross-sectional view taken along line A-A' of FIG. 25.

FIG. 26 is a cross-sectional view taken along line A-A' of FIG. 25.

In the view of the device of FIG. 25, an insulating portion 20, an anode electrode 31 and a conductive layer 32 are omitted.

The semiconductor device 510 is different from the semiconductor device 100 in terms of the structure of the insulating portion 10.

As illustrated in FIGS. 25 and 26, a continuous void V1 is formed in an annular shape around a portion of an n⁻ type semiconductor region 2 and a p-type semiconductor region 3. A plurality of voids V2 surround the void V1. The plurality of voids V2 are aligned in the circumferential direction so as to surround a portion of the n⁻ type semiconductor region 2 and a portion of the p-type semiconductor region 3.

Here, an example of a method of manufacturing the semiconductor device 510 according to the first modification example of the fifth embodiment will be described with reference to FIGS. 27 and 28.

Figure 27:
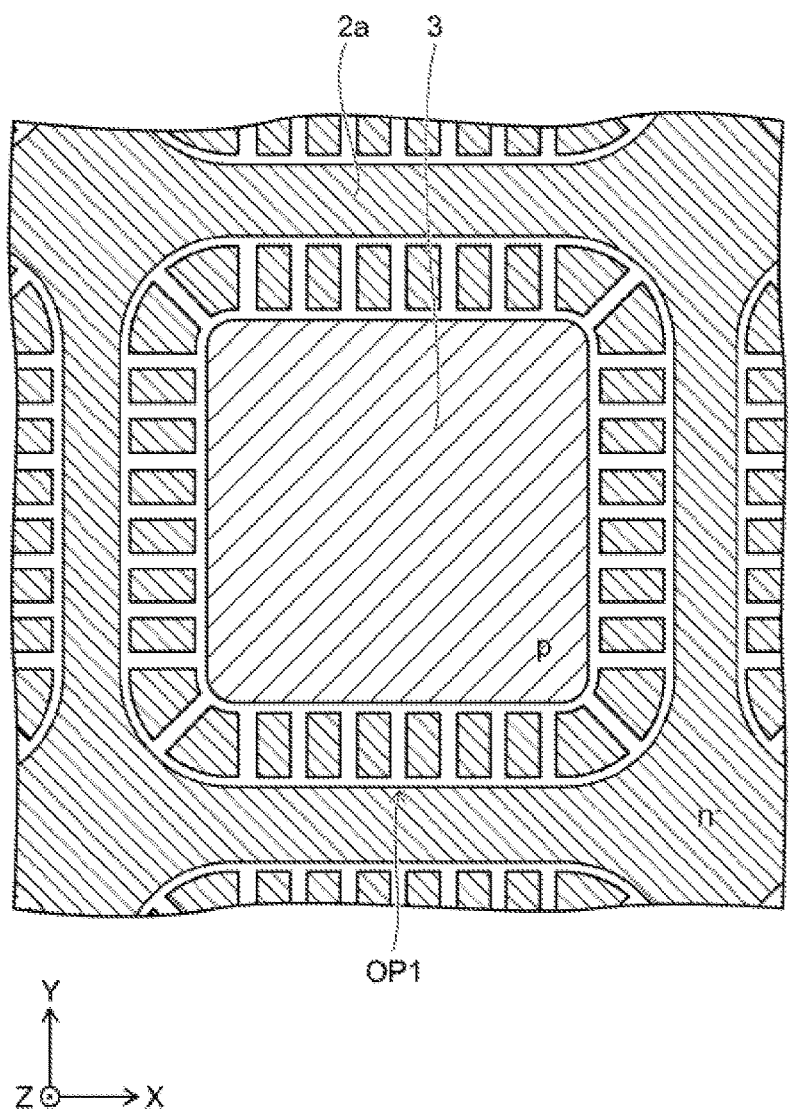
FIG. 27 is a plan view illustrating the result of a step in the process of manufacturing a semiconductor device according to the first modification example of the fifth embodiment.
Figure 28:
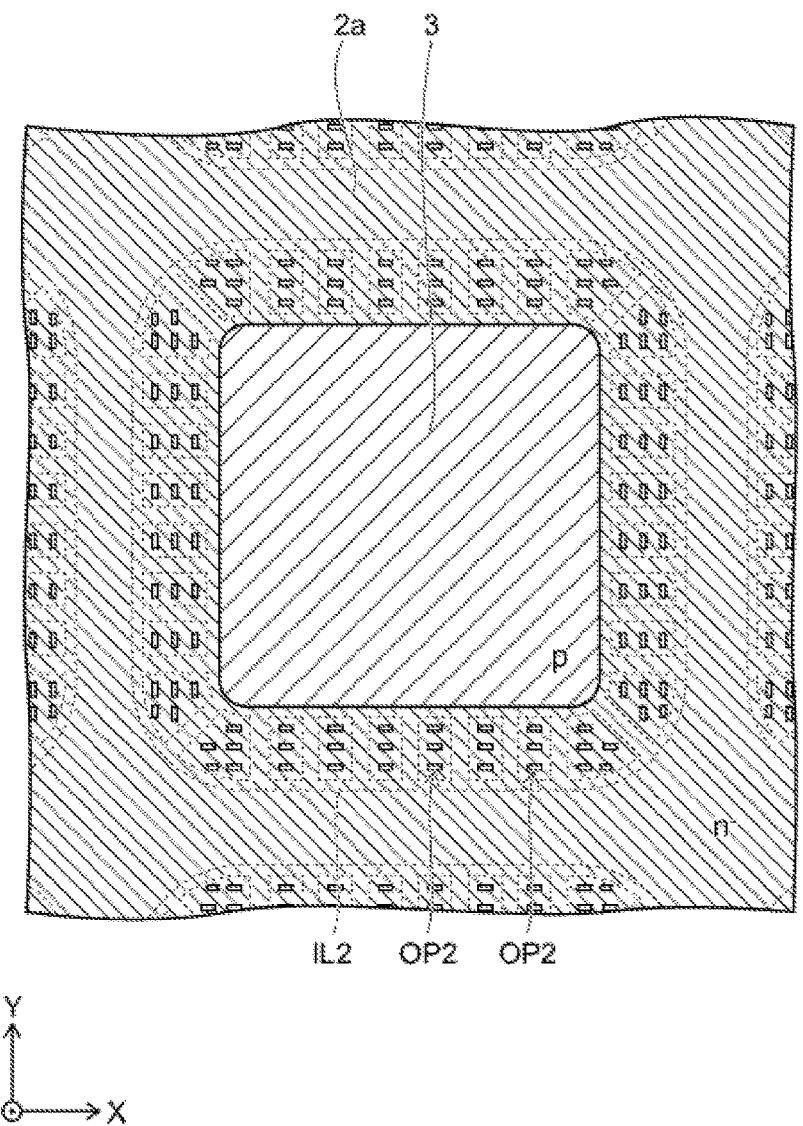
FIG. 28 is a plan view illustrating the result of a step in the process of manufacturing a semiconductor device according to the first modification example of the fifth embodiment.

FIGS. 27 and 28 are a plan view illustrating the results of a step in the process of manufacturing a semiconductor device according to the first modification example of the fifth embodiment.

In the view of the device in FIG. 27, then insulating layer IL1 is omitted.

In addition, in the view of the device in FIG. 28, the insulating layer IL1 and an insulating layer IL3 are omitted and an outer edge of an insulating layer IL2 is indicated by a dashed line.

First, similarly to the process illustrated in FIG. 4, a plurality of first openings OP1 in a trench shape (first openings) are formed in an n⁻ type semiconductor region 2a using the patterned insulating layer IL1 as a mask. At this time, as illustrated in FIG. 27, a portion of the n⁻ type semiconductor region 2 is divided into a plurality of regions in the circumferential direction by the first openings OP1.

Next, the insulating layer IL2 (first insulating layer) is formed along the side wall of the first opening OP1 by performing thermal oxidation, as illustrated in FIG. 27. Next, the insulating layer IL3 (second insulating layer) is formed on the insulating layer IL2. At this time, the first opening OP1 may be filled by the insulating layer IL3 or the void V1 may be formed between the insulating layer IL2 and the insulating layer IL3.

Next, similarly to the process illustrated in FIG. 22, a portion of the insulating layer IL1 and a portion of the insulating layer IL3 are removed forming a plurality of second openings OP2 (second openings) in the insulating layer IL1 and the insulating layer IL3. Then, as illustrated in FIG. 28, a plurality of second openings OP2 are aligned in the circumferential direction around a portion of the n⁻ type semiconductor region 2 and a portion of the p-type semiconductor region 3. In addition, at least one opening OP2 is formed in an area surrounded by the insulating layer IL2.

Next, similarly to the process illustrated in FIG. 24, a portion of the n⁻ type semiconductor region 2a between the insulating layers IL2 is removed via the second openings OP2, and an opening OP3 is formed. Next, the second openings OP2 are closed by the insulating layer IL4 and the void V2 is formed.

Thereafter, similarly to the process illustrated in FIGS. 10 to 12, insulating layers IL1 and IL 3 are patterned to form insulating portion 20, a $p^+$ type anode region 4, the anode electrode 31 and a cathode electrode 30 are serially formed and an $n^+$ type semiconductor layer 1a is singulated, thereby obtaining the semiconductor device 510 illustrated in FIGS. 25 and 26.

Second Modification Example

Figure 29:
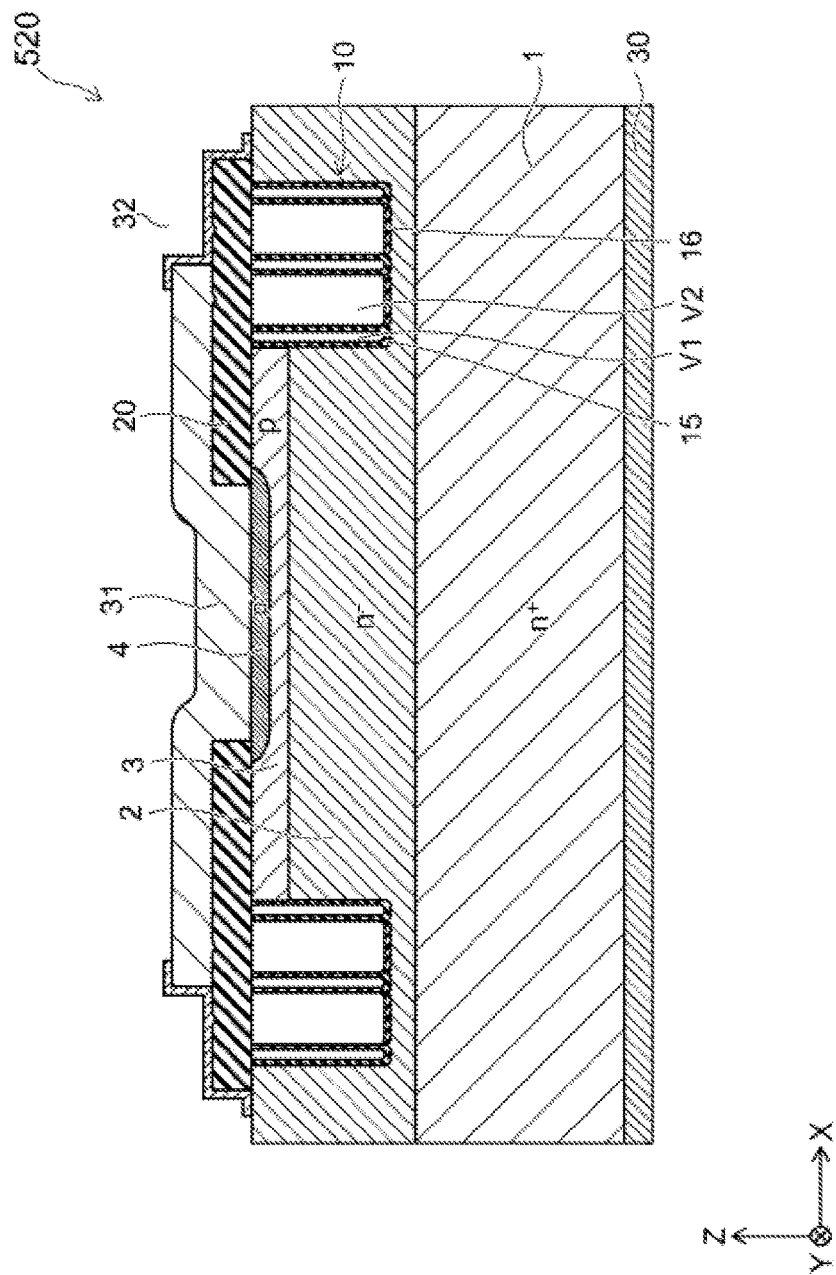
FIG. 29 is a cross-sectional view of a semiconductor device according to a second modification example of the fifth embodiment.

FIG. 29 is a cross-sectional view of a semiconductor device 520 according to a second modification example of the fifth embodiment.

The semiconductor device 520 is different from the semiconductor device 500 in terms of having an insulating layer 16.

As illustrated in FIG. 24, the insulating layer 16 is formed on bottom of a void V2. Therefore, the void V2 is surrounded by an insulating layer 15, the insulating layer 16 and the insulating layer 20.

By forming the insulating layer 16, it is possible to further suppress changing of the breakdown voltage of the semiconductor device due to eternal carrier.

In addition, the insulating layer 16 may be formed on bottom of the void V2 of the semiconductor device 510.

Although an example in which the semiconductor device according to this embodiment is a diode has been described in this embodiment, the semiconductor device is not limited to this example. For example, the semiconductor device may be an IGBT or a power MOSFET. In addition, the process of manufacturing the semiconductor device according to this embodiment may be used processes of manufacturing an IGBT or a power MOSFET.

When a semiconductor device according to this embodiment is a power MOSFET, similarly to the semiconductor device 400, a $p^+$ anode region 4 is omitted, and an $n^+$ source region 5 and a gate electrode 6, a gate insulating film 7 are formed in the semiconductor device 500.

The relative levels of impurity concentrations between the semiconductor regions in the above-described embodiments can be confirmed using, for example, scanning capacitance microscopy (SCM). Meanwhile, a carrier concentration in each semiconductor region can be regarded as being the same as an impurity concentration which is activated in each semiconductor region. Therefore, the relative levels of carrier concentrations between the semiconductor regions can also be confirmed using SCM.

In addition, an impurity concentration in each semiconductor region can be measured by, for example, secondary ion mass spectrometry (SIMS).

Regarding the insulating portion 10, a difference in density between the insulating material in the first insulating portion 11 and the insulating material in the second insulating portion 12 can be confirmed using, for example, a transmission electron microscope (TEM).

Alternatively, the difference can also be confirmed by etching the cross section of the insulating portion 10. For example, regarding dilute hydrofluoric acid or buffered hydrofluoric acid, an etching rate for the first insulating portion 11 is higher than an etching rate for the second insulating portion 12. For this reason, when the cross section of the insulating portion 10 is etched using the liquid chemicals, the position of the second insulating portion 12 becomes higher than the position of the first insulating portion 11, and thus it is possible to confirm the presence or absence of the first insulating portion 11 and the second insulating portion 12 in the insulating portion 10 and a positional relationship between the first and second insulating portions.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Specific configurations of components such as the $n^+$ type semiconductor region 1, the $n^-$ type semiconductor region 2, the p-type semiconductor region 3, the $p^+$ type semiconductor region 4, the $n^+$ type source region 5, the gate electrode 6, the gate insulation layer 7, the insulating portion 20, the electrode 30, and the electrode 31 can be appropriately selected from a known technique by those skilled in the art.

What is claimed is:

1. A semiconductor device comprising:
   a first semiconductor region of a first conductivity type;
   a second semiconductor region of the first conductivity type located on the first semiconductor region;
   a third semiconductor region of a second conductivity type located on the second semiconductor region; and
   an insulating portion located in a vicinity of, and contacting, the second semiconductor region and the third semiconductor region, the insulating portion comprising a plurality of voids therein, the plurality of voids extending around the second semiconductor region,
   wherein each void of the plurality of voids surrounds the second semiconductor region.

2. The device according to claim 1,
   wherein the insulating portion includes:
   a plurality of first insulating portions including a first insulating material, and
   a second insulating portion containing the first insulating material, the density of the first insulating material in the second insulating portion being greater than the density of the first insulating material in the first insulating portion,
   wherein the plurality of first insulating portions and a portion of the second insulating portion are alternately located along a second direction which is perpendicular to a first direction extending from the second semiconductor region toward the third semiconductor region.

3. The device according to claim 2, wherein each void of the plurality of voids is in a different first insulating portion of the plurality of first insulating portions.

4. The device according to claim 3,
   wherein each first insulating portion of the plurality of first insulating portions includes:
   a first insulating region, and
   a second insulating region that contains at least a first element selected from a first group consisting of group 13 elements and group 15 elements,
   wherein a concentration of the first element in the second insulating region is greater than a concentration of the first element in the first insulating region, and
   the void in each first insulating portion is between the first insulating region and the second insulating region in the first direction.

5. The device according to claim 2,
wherein the insulating portion further includes a third insulating portion containing a nitride, and
wherein the third insulating portion is provided between at least one of the plurality of first insulating portions and a second insulating portion.

6. A semiconductor device, comprising: a first semiconductor region of a first conductivity type; a second semiconductor region of the first conductivity type located on the first semiconductor region; a third semiconductor region of the second conductivity type located on the second semiconductor region; an insulating region surrounding the second semiconductor region and the third semiconductor region in a plane, the insulating region comprising a plurality of electrically insulating sub-regions that are annular shapes within the plane; a plurality of voids in the plurality of electrically insulating sub-regions.

7. The semiconductor device of claim 6, wherein
each of the electrically insulating sub-regions comprises the same insulating material, and include a first sub-region, a second sub-region extending along opposed sides of the first sub-region, and a third sub region extending along at least one side of the second sub-region, and
the density of the electrically insulating material in the third sub-region is greater than the density of the electrically insulating material in the second sub-region.

8. The semiconductor device of claim 7, wherein the first sub-region comprises a higher concentration of a group 13 or group 15 element than the concentration of a group 13 or group 15 element in the second sub-region.

9. The semiconductor device of claim 8, wherein the void is covered by the first insulating sub-region.

10. The semiconductor device of claim 9, wherein the second semiconductor region has a first thickness; the third semiconductor layer has a second thickness in a direction extending away from the second semiconductor region; and the thickness of the second sub-region covering the plurality of voids is at least as large as the second thickness.

11. The semiconductor device according to claim 10, wherein the first, second and third insulating sub-regions comprise an oxide.

12. The semiconductor device of claim 11, further comprising:
a fourth insulating sub-region extending between the second and the third sub-regions.

13. A semiconductor device comprising:
a first semiconductor region of a first conductivity type;
a second semiconductor region of the first conductivity type on the first semiconductor region, the second semiconductor region being above the first semiconductor region in a first direction;
a third semiconductor region of a second conductivity type on the second semiconductor region, the third semiconductor region being above the second semiconductor region in the first direction; and
an insulating portion comprising an insulating material and a plurality of voids formed in the insulating material, the insulating portion being adjacent to the second semiconductor region and the third semiconductor region in a second direction crossing the first direction and surrounding the second and third semiconductor regions within a plane parallel to the second direction, the insulating portion contacting a portion of the second semiconductor region and a portion of the third semiconductor region, wherein each void in the plurality of voids has an enclosed annular shape within the plane and individually surrounds the portion of the second semiconductor region within the plane.

14. The device according to claim 13,
wherein the insulating portion includes:
a plurality of first insulating portions including a first insulating material, and
a second insulating portion containing the first insulating material, the density of the first insulating material in the second insulating portion being greater than the density of the first insulating material in the first insulating portion,
wherein the plurality of first insulating portions and a portion of the second insulating portion are alternately located along a second direction which is perpendicular to a first direction extending from the second semiconductor region toward the third semiconductor region.

15. The device according to claim 14, wherein each void of the plurality of voids is in a different first insulating portion of the plurality of first insulating portions.

16. The device according to claim 15,
wherein each first insulating portion of the plurality of first insulating portions includes:
a first insulating region, and
a second insulating region that contains at least a first element selected from a first group consisting of group 13 elements and group 15 elements,
wherein a concentration of the first element in the second insulating region is greater than a concentration of the first element in the first insulating region, and
the void in each first insulating portion is between the first insulating region and the second insulating region in the second direction.

* * * * *